United States Patent
Yamazaki

(10) Patent No.: US 9,847,431 B2
(45) Date of Patent: Dec. 19, 2017

(54) SEMICONDUCTOR DEVICE, MODULE, AND ELECTRONIC DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/723,658

(22) Filed: May 28, 2015

(65) Prior Publication Data

US 2015/0349132 A1    Dec. 3, 2015

(30) Foreign Application Priority Data

May 30, 2014    (JP) .................................. 2014-112242

(51) Int. Cl.
*H01L 29/786* (2006.01)
*H01L 29/24* (2006.01)
(Continued)

(52) U.S. Cl.
CPC .... *H01L 29/78696* (2013.01); *H01L 29/0649* (2013.01); *H01L 29/24* (2013.01);
(Continued)

(58) Field of Classification Search
None
See application file for complete search history.

(56) References Cited

U.S. PATENT DOCUMENTS 5,528,032 A    6/1996    Uchiyama
5,731,856 A    3/1998    Kim et al.
(Continued)

FOREIGN PATENT DOCUMENTS

CN    104704638 A    6/2015
EP      1737044 A    12/2006
(Continued)

OTHER PUBLICATIONS

International Search Report (Application No. PCT/IB2015/053706), dated Sep. 1, 2015.
(Continued)

*Primary Examiner* — Fei Fei Yeung Lopez
(74) *Attorney, Agent, or Firm* — Fish & Richardson P.C.

(57) ABSTRACT

Provided is a semiconductor device including a first insulator, a second insulator, a first oxide semiconductor, a second oxide semiconductor, a first conductor, and a second conductor. The first oxide semiconductor is over the first insulator. The second oxide semiconductor is over the first oxide semiconductor. The first conductor includes a region in contact with a top surface of the second oxide semiconductor. The second insulator includes a region in contact with the top surface of the second oxide semiconductor. The second conductor is over the second oxide semiconductor with the second insulator therebetween. The second oxide semiconductor includes a first layer and a second layer. The first layer includes a region in contact with the first oxide semiconductor. The second layer includes a region in contact with the second insulator. The first layer has a lower proportion of oxygen vacancies than the second layer.

18 Claims, 25 Drawing Sheets

(51) Int. Cl.
*H01L 29/417* (2006.01)
*H01L 29/423* (2006.01)
*H01L 29/06* (2006.01)

(52) U.S. Cl.
CPC .. *H01L 29/41733* (2013.01); *H01L 29/42384* (2013.01); *H01L 29/7869* (2013.01); *H01L 29/78603* (2013.01); *H01L 29/78645* (2013.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,421,083 B2 | 4/2013 | Yamazaki et al. |
| 8,547,771 B2 | 10/2013 | Koyama |
| 8,552,434 B2 | 10/2013 | Akimoto et al. |
| 8,629,434 B2 | 1/2014 | Arai |
| 8,633,492 B2 | 1/2014 | Akimoto et al. |
| 8,686,425 B2 | 4/2014 | Yamazaki et al. |
| 8,723,176 B2 | 5/2014 | Yamazaki |
| 8,748,886 B2 | 6/2014 | Yamazaki et al. |
| 8,785,928 B2 | 7/2014 | Yamazaki et al. |
| 8,796,683 B2 | 8/2014 | Yamazaki |
| 8,890,159 B2 | 11/2014 | Yamazaki et al. |
| 8,901,557 B2 | 12/2014 | Yamazaki |
| 8,921,853 B2 | 12/2014 | Yamazaki |
| 8,946,702 B2 | 2/2015 | Yamazaki et al. |
| 8,952,377 B2 | 2/2015 | Yamazaki et al. |
| 8,952,381 B2 | 2/2015 | Yamazaki |
| 8,963,148 B2 | 2/2015 | Matsubayashi et al. |
| 8,981,372 B2 | 3/2015 | Yamazaki |
| 8,987,731 B2 | 3/2015 | Yamazaki |
| 8,995,174 B2 | 3/2015 | Koyama |
| 9,018,624 B2 | 4/2015 | Yamazaki |
| 9,048,323 B2 | 6/2015 | Yamazaki et al. |
| 9,059,219 B2 | 6/2015 | Sasagawa et al. |
| 9,064,966 B2 | 6/2015 | Yamazaki et al. |
| 9,082,863 B2 | 7/2015 | Yamazaki |
| 9,130,047 B2 | 9/2015 | Sakakura et al. |
| 9,153,436 B2 | 10/2015 | Yamazaki et al. |
| 9,153,649 B2 | 10/2015 | Sasaki et al. |
| 9,153,699 B2 | 10/2015 | Yamazaki |
| 9,166,021 B2 | 10/2015 | Tezuka et al. |
| 9,166,060 B2 | 10/2015 | Yamazaki et al. |
| 9,184,245 B2 | 11/2015 | Yamazaki |
| 9,190,525 B2 | 11/2015 | Yamazaki |
| 9,190,527 B2 | 11/2015 | Tezuka et al. |
| 9,209,256 B2 | 12/2015 | Tokunaga et al. |
| 9,209,307 B2 | 12/2015 | Yamazaki et al. |
| 9,214,474 B2 | 12/2015 | Yamazaki |
| 9,219,161 B2 | 12/2015 | Yamazaki |
| 9,231,111 B2 | 1/2016 | Yamazaki et al. |
| 9,240,492 B2 | 1/2016 | Yamazaki |
| 9,245,958 B2 | 1/2016 | Yamazaki |
| 9,246,011 B2 | 1/2016 | Yamazaki et al. |
| 9,252,283 B2 | 2/2016 | Matsubayashi et al. |
| 9,257,569 B2 | 2/2016 | Yamazaki et al. |
| 9,269,821 B2 | 2/2016 | Yamazaki |
| 9,281,408 B2 | 3/2016 | Yamazaki et al. |
| 9,281,409 B2 | 3/2016 | Yamazaki et al. |
| 9,281,412 B2 | 3/2016 | Takemura |
| 9,287,117 B2 | 3/2016 | Yamazaki et al. |
| 9,287,410 B2 | 3/2016 | Sasagawa et al. |
| 9,287,411 B2 | 3/2016 | Koezuka et al. |
| 9,293,540 B2 | 3/2016 | Yamazaki |
| 9,293,592 B2 | 3/2016 | Yamazaki |
| 9,293,602 B2 | 3/2016 | Yamazaki |
| 9,298,057 B2 | 3/2016 | Hosaka et al. |
| 9,318,618 B2 | 4/2016 | Endo et al. |
| 9,324,875 B2 | 4/2016 | Yamazaki |
| 9,324,876 B2 | 4/2016 | Kobayashi et al. |
| 9,331,100 B2 | 5/2016 | Yamazaki |
| 9,337,344 B2 | 5/2016 | Hanaoka |
| 9,343,579 B2 | 5/2016 | Yamazaki et al. |
| 9,349,593 B2 | 5/2016 | Yamazaki |
| 9,349,751 B2 | 5/2016 | Yamazaki et al. |
| 9,349,869 B2 | 5/2016 | Koezuka et al. |
| 9,368,636 B2 | 6/2016 | Kurata et al. |
| 9,368,640 B2 | 6/2016 | Yamazaki |
| 9,373,711 B2 | 6/2016 | Yamazaki et al. |
| 9,391,095 B2 | 7/2016 | Yamazaki et al. |
| 9,391,096 B2 | 7/2016 | Yamazaki et al. |
| 9,391,157 B2 | 7/2016 | Suzuki et al. |
| 9,397,149 B2 | 7/2016 | Yamazaki et al. |
| 9,397,153 B2 | 7/2016 | Tanaka et al. |
| 9,401,432 B2 | 7/2016 | Kobayashi et al. |
| 9,401,714 B2 | 7/2016 | Yamazaki et al. |
| 9,412,876 B2 | 8/2016 | Koezuka et al. |
| 9,412,877 B2 | 8/2016 | Tanaka et al. |
| 9,443,592 B2 | 9/2016 | Kato et al. |
| 9,443,934 B2 | 9/2016 | Kobayashi et al. |
| 9,450,102 B2 | 9/2016 | Noda et al. |
| 9,455,349 B2 | 9/2016 | Suzawa et al. |
| 9,466,615 B2 | 10/2016 | Miyairi et al. |
| 9,472,678 B2 | 10/2016 | Yamazaki et al. |
| 9,477,294 B2 | 10/2016 | Nishijima et al. |
| 9,496,408 B2 | 11/2016 | Yamazaki et al. |
| 9,496,411 B2 | 11/2016 | Yamazaki et al. |
| 9,530,892 B2 | 12/2016 | Koezuka et al. |
| 9,530,894 B2 | 12/2016 | Koezuka et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |

(56) References Cited

U.S. PATENT DOCUMENTS

| | | |
|---|---|---|
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0161611 A1 | 6/2013 | Yamazaki et al. |
| 2013/0285050 A1 | 10/2013 | Yamazaki et al. |
| 2014/0014947 A1 | 1/2014 | Yamazaki |
| 2014/0027762 A1 | 1/2014 | Tsurume et al. |
| 2014/0042434 A1 | 2/2014 | Yamazaki |
| 2014/0077205 A1 | 3/2014 | Yamazaki et al. |
| 2014/0102877 A1 | 4/2014 | Yamazaki |
| 2014/0103337 A1 | 4/2014 | Yamazaki et al. |
| 2014/0110703 A1 | 4/2014 | Yamazaki |
| 2014/0113405 A1 | 4/2014 | Tsubuku et al. |
| 2014/0175435 A1 | 6/2014 | Yamazaki et al. |
| 2014/0183527 A1* | 7/2014 | Yamazaki ............ H01L 29/7869 257/43 |
| 2014/0225104 A1* | 8/2014 | Yamazaki ............ H01L 29/7869 257/43 |
| 2014/0239296 A1 | 8/2014 | Tokunaga et al. |
| 2014/0252345 A1 | 9/2014 | Tsubuku et al. |
| 2014/0264324 A1 | 9/2014 | Yamazaki |
| 2014/0306217 A1 | 10/2014 | Yamazaki et al. |
| 2014/0306221 A1 | 10/2014 | Yamazaki et al. |
| 2014/0319516 A1 | 10/2014 | Tanaka et al. |
| 2014/0339544 A1 | 11/2014 | Hanaoka et al. |
| 2015/0001533 A1 | 1/2015 | Kuwabara et al. |
| 2015/0008428 A1 | 1/2015 | Yamamoto et al. |
| 2015/0011046 A1 | 1/2015 | Tanaka et al. |
| 2015/0028330 A1 | 1/2015 | Yamazaki et al. |
| 2015/0034949 A1 | 2/2015 | Yamazaki |
| 2015/0060848 A1 | 3/2015 | Sasagawa et al. |
| 2015/0076496 A1 | 3/2015 | Tanaka et al. |
| 2015/0079728 A1 | 3/2015 | Yamazaki |
| 2015/0079729 A1 | 3/2015 | Yamazaki |
| 2015/0097181 A1 | 4/2015 | Yamazaki |
| 2015/0109019 A1 | 4/2015 | Matsuda et al. |
| 2015/0155363 A1 | 6/2015 | Nakazawa et al. |
| 2015/0171116 A1 | 6/2015 | Okazaki et al. |
| 2015/0179803 A1 | 6/2015 | Yamazaki et al. |
| 2015/0187824 A1 | 7/2015 | Yamazaki et al. |
| 2015/0255310 A1 | 9/2015 | Yamazaki et al. |
| 2015/0311347 A1 | 10/2015 | Yamazaki |
| 2015/0325708 A1 | 11/2015 | Yakubo et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2012-059860 A | 3/2012 |
| JP | 2012-257187 A | 12/2012 |
| JP | 2013-251534 A | 12/2013 |
| JP | 2014-082390 A | 5/2014 |
| JP | 2014-099602 A | 5/2014 |
| JP | 2014-129590 A | 7/2014 |
| KR | 2013-0122554 A | 11/2013 |
| KR | 2015-0067207 A | 6/2015 |
| TW | 201431073 | 8/2014 |
| WO | WO-2004/114391 | 12/2004 |
| WO | WO-2014/061713 | 4/2014 |

OTHER PUBLICATIONS

Written Opinion (Application No. PCT/IB2015/053706), dated Sep. 1, 2015.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Sympsoum Digest of Technical Papers, May 31, 2009, pp. 578-581.

Osada.T et al., "15.2: Development of Driver-Integrated Panel Using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Shunpei Yamazaki et al.; "Properties of crystalline In—Ga—Zn—oxide semiconductor and its transistor characteristics"; Japanese Journal of Applied Physics 53, 04ED18-1-04ED1810; 2014.

* cited by examiner

FIG. 24A
FIG. 24B
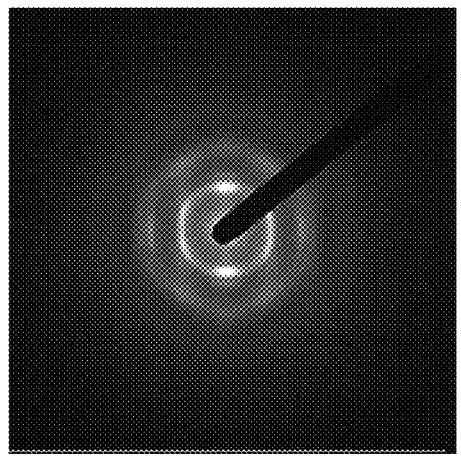
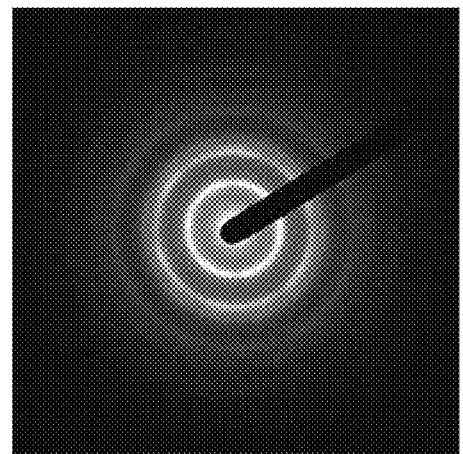

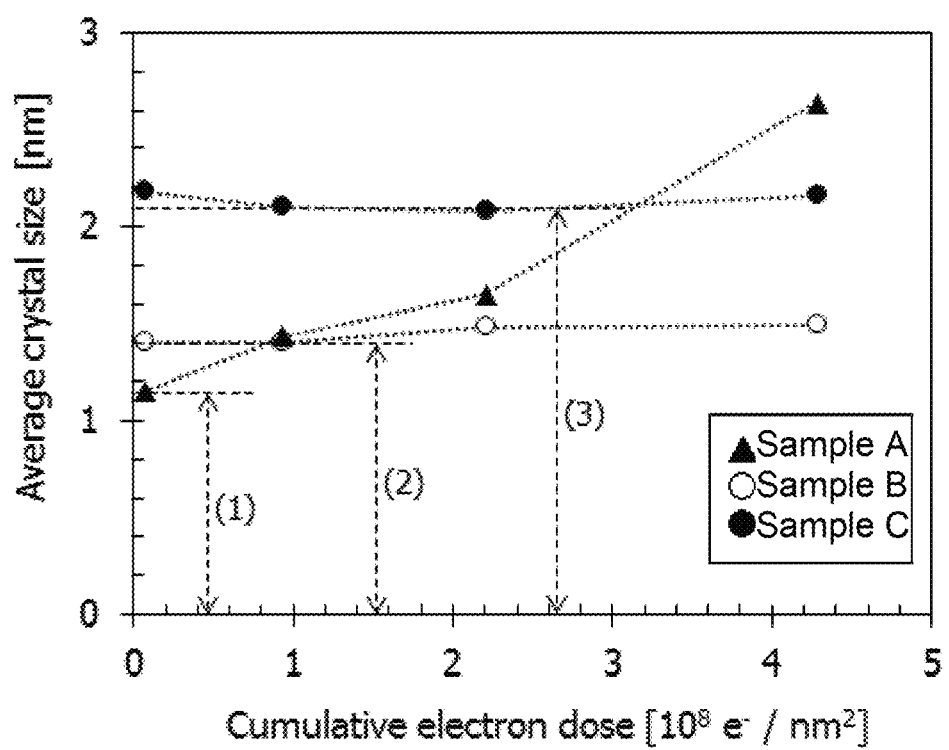

SEMICONDUCTOR DEVICE, MODULE, AND ELECTRONIC DEVICE

TECHNICAL FIELD

The present invention relates to, for example, a transistor, a semiconductor device, and manufacturing methods thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where a driver circuit and a pixel circuit are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

Recently, a transistor which includes an amorphous oxide semiconductor and a transistor which includes an amorphous oxide semiconductor containing a microcrystal have been disclosed (see Patent Document 1). An oxide semiconductor can be formed by a sputtering method or the like, and thus can be used for a semiconductor of a transistor in a large display device. Because a transistor including an oxide semiconductor has high field-effect mobility, a high-performance display device in which, for example, a driver circuit and a pixel circuit are formed over the same substrate can be obtained. In addition, there is an advantage that capital investment can be reduced because part of production equipment for a transistor including amorphous silicon can be retrofitted and utilized.

In 2014, it was reported that a transistor including a crystalline In—Ga—Zn oxide has more excellent electrical characteristics and higher reliability than a transistor including an amorphous In—Ga—Zn oxide (see Non-Patent Document 1). Non-Patent Document 1 reports that a crystal boundary is not clearly observed in an In—Ga—Zn oxide including a c-axis aligned crystalline oxide semiconductor (CAAC-OS).

It is known that a transistor including an oxide semiconductor has an extremely low leakage current in an off state. For example, Patent Document 2 discloses a low-power CPU utilizing a characteristic of low leakage current of the transistor including an oxide semiconductor. Patent Document 3 discloses that a transistor having high field-effect mobility can be obtained by a well potential formed using an active layer formed of an oxide semiconductor.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

Non-Patent Document

[Non-Patent Document 1] S. Yamazaki, H. Suzawa, K. Inoue, K. Kato, T. Hirohashi, K. Okazaki, and N. Kimizuka, *Japanese Journal of Applied Physics*, Vol. 53, 2014, 04ED18

DISCLOSURE OF INVENTION

An object is to provide a semiconductor device with excellent electrical characteristics. Another object is to provide a semiconductor device with stable electrical characteristics. Another object is to provide a semiconductor device with small variation in electrical characteristics. Another object is to provide a highly integrated semiconductor device. Another object is to provide a module including any of the above semiconductor devices. Another object is to provide an electronic device including any of the above semiconductor devices or the module.

Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including a first insulator, a second insulator, a first oxide semiconductor, a second oxide semiconductor, a first conductor, and a second conductor. The first oxide semiconductor is over the first insulator. The second oxide semiconductor is over the first oxide semiconductor. The first conductor includes a region in contact with a top surface of the second oxide semiconductor. The second insulator includes a region in contact with the top surface of the second oxide semiconductor. The second conductor is over the second oxide semiconductor with the second insulator therebetween. The second oxide semiconductor includes a first layer and a second layer. The first layer includes a region in contact with the first oxide semiconductor. The second layer includes a region in contact with the second insulator. The first layer has a lower proportion of oxygen vacancies than the second layer.

(2) Another embodiment of the present invention is the semiconductor device according to (1), in which a third oxide semiconductor is between the second oxide semiconductor and the second insulator.

(3) Another embodiment of the present invention is the semiconductor device according to (1) or (2), in which the second layer includes a first region in contact with the second insulator and a second region in contact with the first conductor, and a thickness of the first region is smaller than that of the second region.

(4) Another embodiment of the present invention is the semiconductor device according to any one of (1) to (3), in which the thickness of the first region is greater than or equal to 1 nm and less than or equal to 10 nm.

(5) Another embodiment of the present invention is the semiconductor device according to any one of (1) to (4), in which the second region includes a region with a lower resistance than the first region.

(6) Another embodiment of the present invention is the semiconductor device according to any one of (1) to (5), in which a third insulator is between the first conductor and the second insulator.

(7) Another embodiment of the present invention is the semiconductor device according to any one of (1) to (6), in which the second oxide semiconductor is an oxide containing indium, an element M (M is aluminum, gallium, yttrium, or tin), and zinc.

(8) Another embodiment of the present invention is a module including the semiconductor device according to any one of (1) to (7), and a printed board.

(9) Another embodiment of the present invention is an electronic device including either the semiconductor device according to any one of (1) to (7) or the module according to (8), and at least one of a speaker, an operation key, and a battery.

Although an example of using an oxide semiconductor is described here, one embodiment of the present invention is not limited to a semiconductor device including an oxide semiconductor, and the like. For example, silicon (including strained silicon), germanium, silicon germanium, silicon carbide, gallium arsenide, aluminum gallium arsenide, indium phosphide, gallium nitride, an organic semiconductor, or the like can be used in some cases.

A semiconductor device with excellent electrical characteristics can be provided. A semiconductor device with stable electrical characteristics can be provided. A semiconductor device with small variation in electrical characteristics can be provided. A highly integrated semiconductor device can be provided. A module including any of the above semiconductor devices can be provided. An electronic device including any of the above semiconductor devices or the module can be provided.

A novel semiconductor device can be provided. A novel module can be provided. A novel electronic device can be provided.

Note that the description of these effects does not disturb the existence of other effects. One embodiment of the present invention does not necessarily have all the effects. Other effects will be apparent from and can be derived from the description of the specification, the drawings, the claims, and the like.

BRIEF DESCRIPTION OF DRAWINGS

FIGS. 24A and 24B show electron diffraction patterns of a CAAC-OS.

FIG. 25 shows a change in crystal part of an In—Ga—Zn oxide induced by electron irradiation.

BEST MODE FOR CARRYING OUT THE INVENTION

Figure 1A:
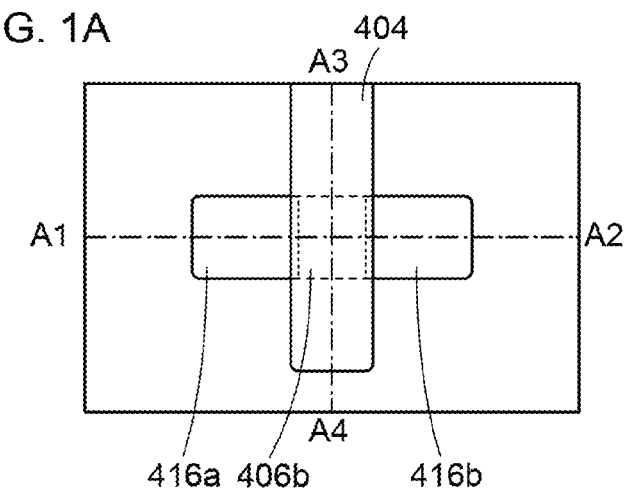
FIGS. 1A to 1C are a top view, a cross-sectional view, and a band diagram of a transistor according to one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, the terms "film" and "layer" can be interchanged with each other.

When there is a curve between two facing side surfaces, the curved portion is referred to as a corner. When there is a curve between two facing side surfaces, the two facing side surfaces can also be referred to as a curved surface.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification, the phrase "A has a region with a concentration B" includes, for example, the cases where "the concentration in the entire region in a region of A in the depth direction is B", "the average concentration in a region of A in the depth direction is B", "the median value of the concentration in a region of A in the depth direction is B", "the maximum value of the concentration in a region of A in the depth direction is B", "the minimum value of the concentration in a region of A in the depth direction is B", "a convergence value of the concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternatively referred to as the description "one of end portions of A is positioned on an outer side than one of end portions of B".

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

<Transistor>

A transistor of one embodiment of the present invention is described below. Note that the structures of the transistors can be combined with each other as appropriate in different drawings.

<Transistor Structure 1>

Figure 1B:
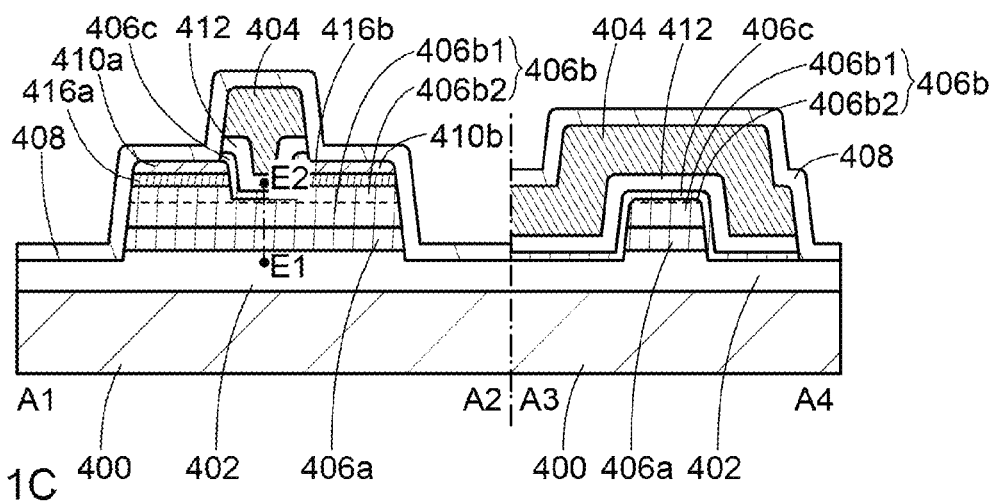
Figure 1C:
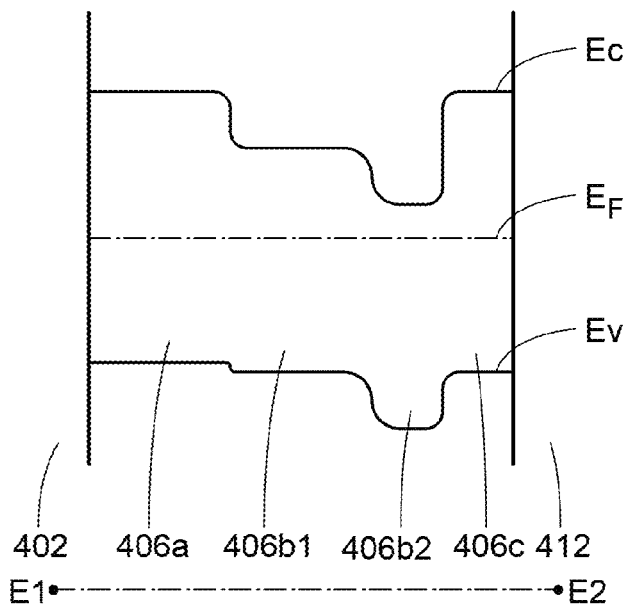

FIGS. 1A to 1C illustrates a transistor of one embodiment of the present invention. FIG. 1A is a top view of the transistor. FIG. 1B is a cross-sectional view taken along dashed-dotted line A1-A2 and dashed-dotted line A3-A4 in FIG. 1A. FIG. 1C is a band diagram taken along dashed-dotted line E1-E2 in FIG. 1B.

The transistor in FIG. 1B includes an insulator 402 over a substrate 400, a semiconductor 406a over the insulator 402, a semiconductor 406b over the semiconductor 406a, a conductor 416a over the semiconductor 406b, a conductor 416b over the semiconductor 406b, an insulator 410a over the conductor 416a, an insulator 410b over the conductor 416b, a semiconductor 406c over the semiconductor 406b, an insulator 412 over the semiconductor 406c, and a conductor 404 over the insulator 412. An insulator 408 may be provided so as to cover the transistor. The insulator 402 is not necessarily provided. The insulator 410a is not necessarily provided. The insulator 410b is not necessarily provided. The semiconductor 406a is not necessarily provided. The semiconductor 406c is not necessarily provided.

The semiconductor 406b may have a region which functions as a channel formation region of the transistor. The conductors 416a and 416b include regions functioning as a source electrode and a drain electrode of the transistor. The insulator 412 includes a region functioning as a gate insulator of the transistor. The conductor 404 has a region functioning as a gate electrode of the transistor. The insulator 408 has a function of preventing impurities from entering the transistor.

In forming the semiconductor 406a and the like, part of the insulator 402 may be etched. That is, a top surface of the insulator 402 may have unevenness. For example, as shown in FIG. 1B, the insulator 402 may have a projection in a region in contact with the semiconductor 406a and the other region of the insulator 402 may have a depression.

The semiconductor 406c includes a region in contact with a top surface of the semiconductor 406b, regions in contact with side surfaces of the conductors 416a and 416b, regions in contact with top surfaces and side surfaces of the insulators 410a and 410b.

An entire bottom surface of the conductor 416a is in contact with the top surface of the semiconductor 406b. That is, the conductor 416a does not have a region in contact with a surface (a side surface and the like) other than the top surface of the semiconductor 406b. Furthermore, an entire bottom surface of the conductor 416b is in contact with the top surface of the semiconductor 406b. That is, the conductor 416b does not have a region in contact with a surface (a side surface and the like) other than the top surface of the semiconductor 406b. Thus, parasitic capacitance between the conductors 416a and 416b and the conductor 404 and the like is small. Oxygen included in the semiconductor 406b is released in some cases in regions where the conductors 416a and 416b are in contact with the semiconductor 406b depending on the kinds of the conductors 416a and 416b. Thus, a conductor from which oxygen in the semiconductor 406b is less likely to be released is preferably used as the conductors 416a and 416b. For example, a metal containing nitrogen, a metal nitride, or the like may be used as the conductors 416a and 416b.

The conductor 404 has a region overlapping with the conductor 416a and a region overlapping with the conductor 416b. At this time, the insulator 410a and the like, and the insulator 410b and the like are provided between the conductor 404 and the conductor 416a, and between the conductor 404 and the conductor 416b, respectively, whereby parasitic capacitance can be further reduced.

Furthermore, the conductor 404 also has a region in contact with a side surface of the semiconductor 406b. Thus, the semiconductor 406b can be electrically surrounded by an electric field of the conductor 404. Such a structure of a transistor in which a semiconductor is electrically surrounded by an electric field generated from a conductor is referred to as a surrounded channel (s-channel) structure. Therefore, a channel is formed in the whole (bulk) of the semiconductor 406b in some cases. In the s-channel structure, a large amount of current can flow between a source and a drain of a transistor, so that a high on-state current can be obtained. Furthermore, a punch-through phenomenon can be suppressed in the s-channel structure; thus, electric characteristics in a saturation region of the transistor can be stable.

Note that because the conductors 416a and 416b do not have regions in contact with the side surfaces of the semiconductor 406b, an electric field of the conductor 404 is less likely to be blocked by the conductors 416a and 416b. Thus, advantages of the s-channel structure can be more easily obtained.

<Semiconductor>

Next, a semiconductor which can be used as the semiconductor 406a, the semiconductor 406b, the semiconductor 406c, or the like is described below.

The semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the semiconductor 406a and the semiconductor 406c are oxide semiconductors including one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 406b, when a summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor 406c, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 406c may be an oxide that is a type the same as that of the semiconductor 406a. Note that the semiconductor 406a and/or the semiconductor 406c do/does not necessarily contain indium in some cases. For example, the semiconductor 406a and/or the semiconductor 406c may be gallium oxide.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

An indium gallium oxide has small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, more preferably higher than or equal to 90%.

The composition of an In-M-Zn oxide that is a kind of an oxide semiconductor is described below. The element M is aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of [In]:[M]:[Zn]=1+α:1−α:1, [In]:[M]:[Zn]=1+α:1−α:2, [In]:[M]:[Zn]=1+α:1−α:3, [In]:[M]:[Zn]=1+α:1−α:4, and [In]:[M]:[Zn]=1+α:1−α:5. This is the composition that allows oxides as raw materials to be a solid solution when mixed and subjected to baking at 1350° C.

Therefore, when an oxide has a composition close to the above composition that allows the oxide to be a solid solution, a CAAC-OS with high crystallinity can be obtained.

When a CAAC-OS is deposited, because of heating of a substrate surface (the surface on which the CAAC-OS is deposited), space heating, or the like, the composition of the film is sometimes different from that of a target as a source or the like. For example, since zinc oxide sublimates more easily than indium oxide, gallium oxide, or the like, the source and the film are likely to have different compositions. Thus, a source is preferably selected taking into account the change in composition. Note that a difference between the compositions of the source and the film is also affected by a pressure or a gas used for the deposition as well as a temperature.

The composition of a typical oxide target and the composition of an oxide that is formed by a sputtering method using the oxide target are described below. For example, when an oxide target of In:Ga:Zn=1:1:1 [atomic ratio] is used for deposition, the composition of an In—Ga—Zn oxide is In:Ga:Zn=1:(0.8 to 1.1):(0.5 to 0.9) [atomic ratio]. When an oxide target of In:Ga:Zn=3:1:2 [atomic ratio] is used for deposition, the composition of an In—Ga—Zn oxide is In:Ga:Zn=3:(0.8 to 1.1):(1.0 to 1.8) [atomic ratio]. When an oxide target of In:Ga:Zn=4:2:4.1 [atomic ratio] is used for deposition, the composition of an In—Ga—Zn oxide is In:Ga:Zn=4:(2.6 to 3.2):(2.2 to 3.4) [atomic ratio].

Note that the semiconductor 406a is preferably a semiconductor containing excess oxygen. The semiconductor containing excess oxygen means a semiconductor from which oxygen is released by heat treatment. Therefore, the semiconductor 406a is a semiconductor in which oxygen can be moved.

The semiconductor 406a containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such an oxygen vacancy and forms an electron serving as a carrier. Therefore, by reducing the oxygen vacancies in the semiconductor 406b, the transistor can have stable electrical characteristics.

Figure 2A:
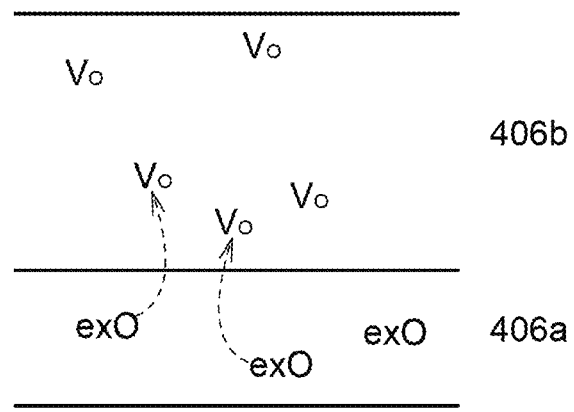
FIGS. 2A and 2B are cross-sectional views illustrating an oxide semiconductor according to one embodiment of the present invention.
Figure 2B:
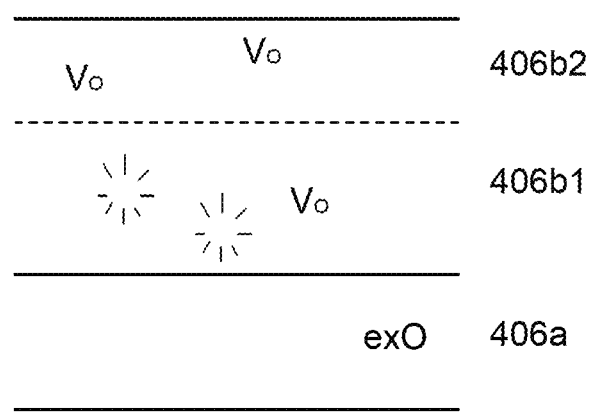

FIGS. 2A and 2B are cross-sectional views illustrating a state where oxygen vacancies (also indicated as Vo) in the semiconductor 406b are reduced owing to the excess oxygen (also indicated as exO) in the semiconductor 406a. As illustrated in FIG. 2A, the semiconductor 406a contains excess oxygen, and the semiconductor 406b has oxygen vacancies.

When heat treatment is performed, excess oxygen in the semiconductor 406a is moved. When part of the moved excess oxygen reaches oxygen vacancies in the semiconductor 406b, the oxygen vacancies disappear. In this manner, oxygen vacancies in the semiconductor 406b are reduced from the semiconductor 406a side. Thus, the semiconductor 406b is divided into a layer 406b1 with a low proportion of oxygen vacancies and a layer 406b2 with a high proportion of oxygen vacancies (see FIG. 2B). Note that division of the semiconductor 406b into the layer 406b1 and the layer 406b2 is not limited to such a mechanism. For example, in the case where oxygen vacancies are formed in the vicinity of the top surface of the semiconductor 406b by performing some sort of processing on the top surface of the semiconductor 406b, a layer structure which is similar to that described above is obtained.

In the case where the oxide semiconductor contains oxygen vacancies, donor levels are formed by entry of hydrogen into sites of oxygen vacancies in some cases. That is, the layer 406b2 may have higher carrier density than the layer 406b1. Thus, a band structure taken along dashed-dotted line E1-E2 in FIG. 1B corresponds to a band diagram illustrated in FIG. 1C. In FIG. 1C, the energy at the valence band maximum is denoted by Ev, the energy at the conduction band minimum is denoted by Ec, and the Fermi level is denoted by $E_F$.

At this time, when a gate voltage is applied, a channel is formed in the layer 406b2 included in the semiconductor 406b having the highest electron affinity in the semiconductor 406a, the semiconductor 406b, and the semiconductor 406c.

Here, the layer 406b1 and the layer 406b2 are included in the same semiconductor 406b, which are only different in the relative positions of the Fermi level. There is a possibility that the interface between the layer 406b1 and the layer 406b2 is not clear. Thus, the energy at the valence band maximum and the energy at the conduction band minimum are continuously changed between the layer 406b1 and the layer 406b2. Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of interface states. For that reason, the stack of the semiconductor 406a, the semiconductor 406b, and the semiconductor 406c has a band diagram where energy at each interface and in the vicinity of the interface is changed continuously (continuous junction).

At this time, electrons move mainly in the layer 406b2 included in the semiconductor 406b, not in the semiconductor 406a and in the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 406b (a formation surface; here, the semiconductor 406a) is less than 1 nm, preferably less than 0.6 nm, further preferably less than 0.5 nm, or still further preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

Moreover, the thickness of the semiconductor 406c is preferably as small as possible to increase the on-state current of the transistor. For example, the semiconductor layer 406c may include a region with a thickness of less than 10 nm, preferably less than or equal to 5 nm, and further preferably less than or equal to 3 nm. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. For example, the semiconductor layer 406c may include a region with a thickness of greater than or equal to 0.3 nm, preferably greater than or equal to 1 nm, and further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a may include a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a may include a region with a thickness of, for example, less than or equal to 200 nm, preferably less than or equal to 120 nm, more preferably less than or equal to 80 nm.

For example, a region with a silicon concentration of lower than $1 \times 10^{19}$ atoms/cm$^3$, preferably lower than $5 \times 10^{18}$ atoms/cm$^3$, more preferably lower than $2 \times 10^{18}$ atoms/cm$^3$ which is measured by secondary ion mass spectrometry (SIMS) is provided between the semiconductor 406b and the semiconductor 406a. A region with a silicon concentration of lower than $1 \times 10^{19}$ atoms/cm$^3$, preferably lower than $5 \times 10^{18}$ atoms/cm$^3$, more preferably lower than $2 \times 10^{18}$ atoms/cm$^3$ which is measured by SIMS is provided between the semiconductor 406b and the semiconductor 406c.

The semiconductor 406b has a region in which the concentration of hydrogen measured by SIMS is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. The semiconductor 406b has a region in which the concentration of nitrogen measured by SIMS is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, below the semiconductor 406a, over the semiconductor 406c, and below the semiconductor 406c.

Oxide semiconductors are preferably used as the semiconductors 406a, 406b, and 406c. However, silicon (including strained silicon), germanium, silicon germanium, silicon carbide, gallium arsenide, aluminum gallium arsenide, indium phosphide, gallium nitride, an organic semiconductor, or the like can be used in some cases.

<Oxide Semiconductor Structure>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 21A:
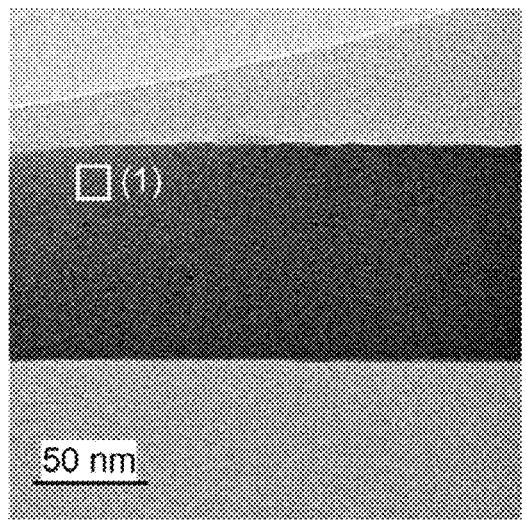
FIGS. 21A to 21D are Cs-corrected high-resolution TEM images of a cross section of a CAAC-OS and a cross-sectional schematic view of the CAAC-OS.

The CAAC-OS observed with a TEM is described below. FIG. 21A shows a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 21B:
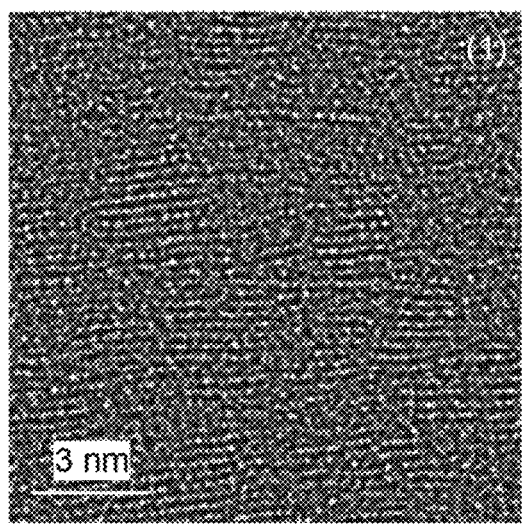

FIG. 21B is an enlarged Cs-corrected high-resolution TEM image of a region (1) in FIG. 21A. FIG. 21B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 21C:
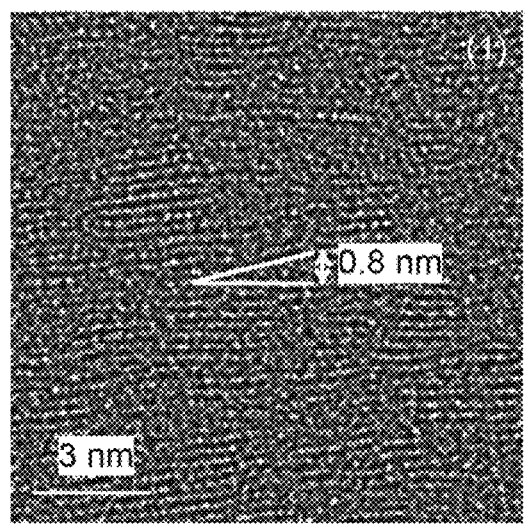

As shown in FIG. 21B, the CAAC-OS film has a characteristic atomic arrangement. The characteristic atomic arrangement is denoted by an auxiliary line in FIG. 21C. FIGS. 21B and 21C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 21D:
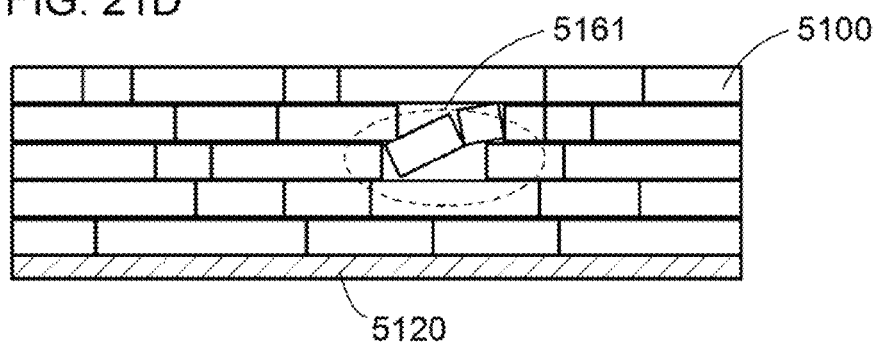

Here, according to the Cs-corrected high-resolution TEM images, the schematic arrangement of pellets 5100 of a CAAC-OS layer over a substrate 5120 is illustrated by such a structure in which bricks or blocks are stacked (see FIG. 21D). The part in which the pellets are tilted as observed in FIG. 21C corresponds to a region 5161 shown in FIG. 21D.

Figure 22A:
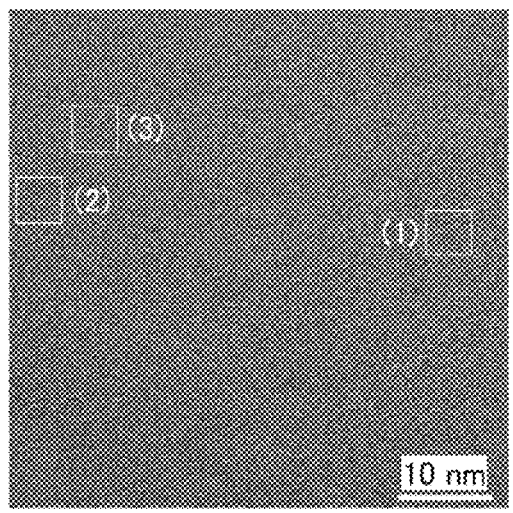
FIGS. 22A to 22D are Cs-corrected high-resolution TEM images of a plane of a CAAC-OS.
Figure 22B:
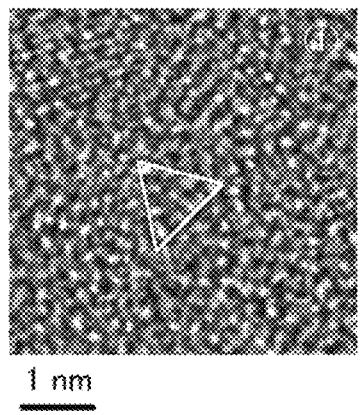
Figure 22C:
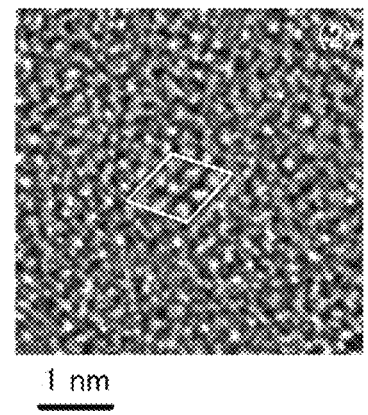
Figure 22D:
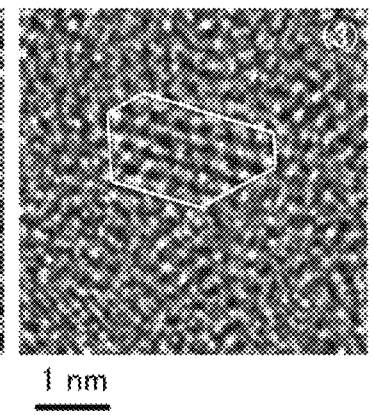

FIG. 22A shows a Cs-corrected high-resolution TEM image of a plane of the CAAC-OS observed from a direction substantially perpendicular to the sample surface. FIGS. 22B, 22C, and 22D are enlarged Cs-corrected high-resolution TEM images of regions (1), (2), and (3) in FIG. 22A, respectively. FIGS. 22B, 22C, and 22D indicate that metal atoms are arranged in a triangular, quadrangular, or hexagonal configuration in a pellet. However, there is no regularity of arrangement of metal atoms between different pellets.

Figure 23A:
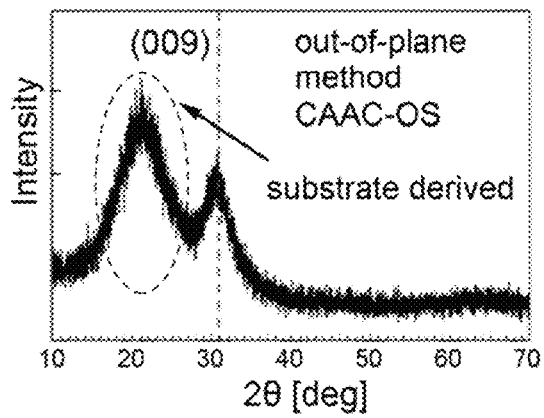
FIGS. 23A to 23C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 23A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 23B:
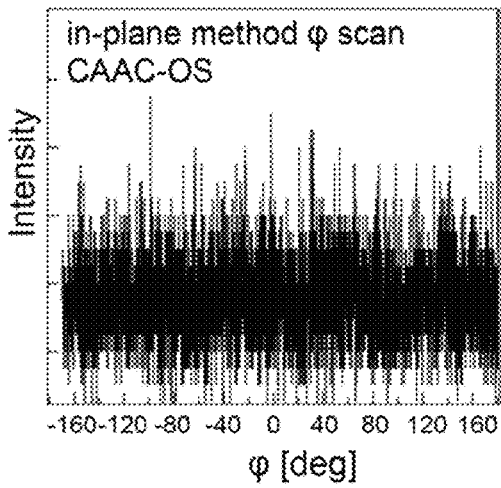
Figure 23C:
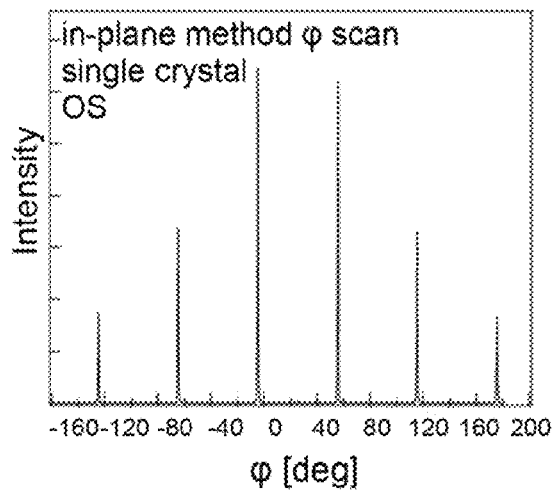

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 23B, a peak is not clearly observed. In contrast, in the case of a single crystal oxide semiconductor of $InGaZnO_4$, when f scan is performed with 2θ fixed at around 56°, as shown in FIG. 23C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 24A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 24B shows a diffraction pattern obtained in such a manner that an electron beam with a probe diameter of 300 nm is incident on the same sample in a direction perpendicular to the sample surface. As shown in FIG. 24B, a ring-like diffraction pattern is observed. Thus, the electron diffraction also indicates that the a-axes and b-axes of the pellets included in the CAAC-OS do not have regular alignment. The first ring in FIG. 24B is considered to be derived from the (010) plane, the (100) plane, and the like of the $InGaZnO_4$ crystal. Furthermore, it is supposed that the second ring in FIG. 24B is derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancy in the oxide semiconductor serves as a carrier trap or serves as a carrier generation source when hydrogen is captured therein.

The CAAC-OS having small amounts of impurities and oxygen vacancy is an oxide semiconductor film with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS and an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS is an oxide semiconductor having a structure between the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

FIG. 25 shows change in the average size of crystal parts (at 22 points to 45 points) in each sample. Note that the crystal part size corresponds to the length of a lattice fringe. FIG. 25 indicates that the crystal part size in the a-like OS increases with an increase in the cumulative electron dose. Specifically, as shown by (1) in FIG. 25, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 25, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Components of Transistor>

Other components of the transistor of one embodiment of the present invention is described below.

As the substrate 400, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate of silicon, germanium, or the like or a compound semiconductor substrate of silicon carbide, silicon germanium, gallium arsenide, indium phosphide, zinc oxide, gallium oxide, or the like is used. A semiconductor substrate in which an insulator region is provided in the above semiconductor substrate, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, for example, metal, an alloy, resin, glass, or fiber thereof can be used. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400 and the like. In the case where the semiconductor 406b is an oxide semiconductor, the insulator 402 can have a function of supplying oxygen to the semiconductor 406b.

The insulator 402 is preferably an insulator containing excess oxygen.

The insulator containing excess oxygen means an insulator from which oxygen is released by heat treatment, for example. Silicon oxide containing excess oxygen means silicon oxide from which oxygen can be released by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406b.

The insulator containing excess oxygen has a function of reducing oxygen vacancies in the semiconductor 406 in some cases. Such oxygen vacancies form DOS in the semiconductor 406 and serve as hole traps or the like. In addition, hydrogen comes into the site of such an oxygen vacancy and forms an electron serving as a carrier. Therefore, by reducing the oxygen vacancies in the semiconductor 406, the transistor can have stable electrical characteristics.

Here, an insulator from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times\alpha \quad \text{[Formula 1]}$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value $\alpha$ is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing hydrogen atoms at $1\times10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5\times10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

Each of the conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

<Modification Example of Transistor Structure 1>

The transistor in FIGS. 1A to 1C can be modified into various modes.

Figure 3A:
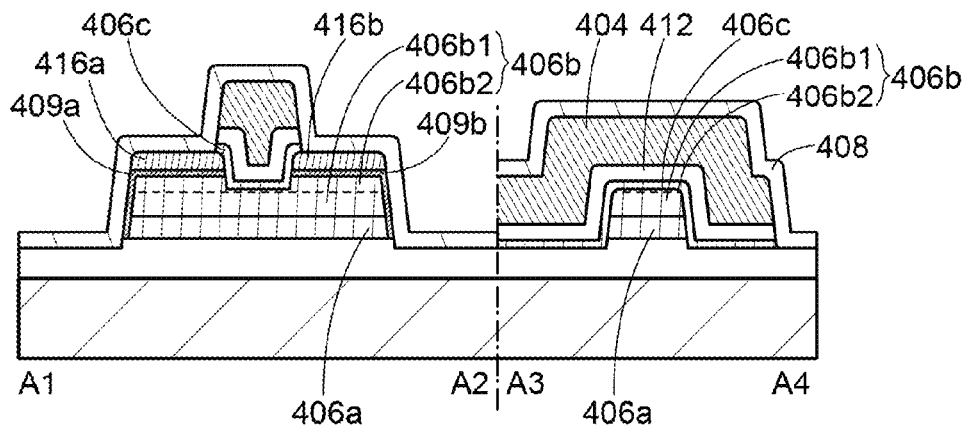
FIGS. 3A to 3C are cross-sectional views each illustrating a transistor according to one embodiment of the present invention.

For example, the transistor in FIG. 3A is different from the transistor in FIG. 1 in that the insulators 410a and 410b are not included, and regions 409a and 409b are formed over part of side surfaces of the semiconductor 406a and part of a top surface and side surfaces of the semiconductor 406b. Note that the regions 409a and 409b are not formed in the channel formation region. The regions 409a and 409b are regions whose resistivity is higher than that of the conductor 416a and/or the conductor 416b and whose resistivity is lower than that of the other region of the semiconductor 406b, for example. Furthermore, the regions 409a and 409b have a function of reducing contact resistance between the conductors 416a and 416b and the semiconductor 406b. As a result, electric characteristic in a saturation region of the transistor can be stable in some cases. Furthermore, the on-state current of the transistor can be increased in some cases. The regions 409a and 409b can be formed, for example, by addition of one or more elements selected from hydrogen, boron, nitrogen, phosphorus, and argon to part of the semiconductors 406a and 406b. Specifically, a trivalent element or a quinquevalent element is preferably added. The addition of the element is performed by plasma treatment or ion implantation treatment.

Figure 3B:
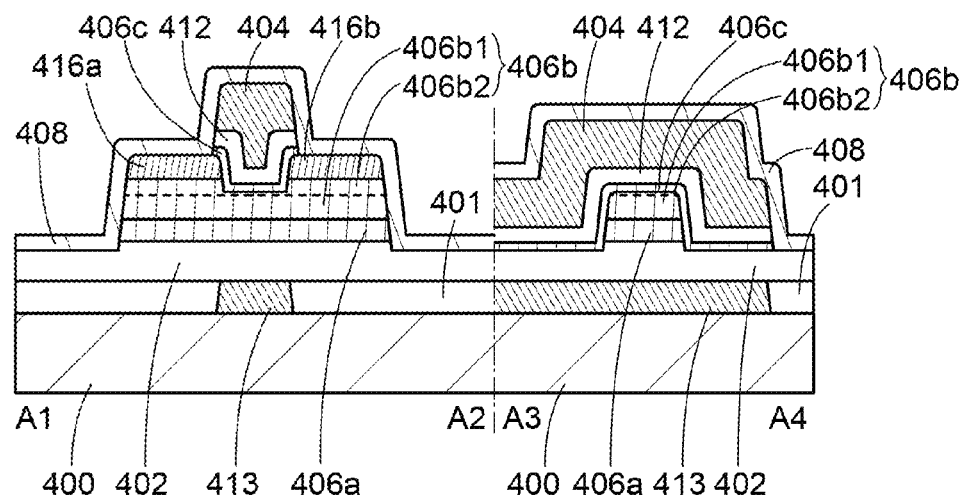

Moreover, the transistor illustrated in FIG. 3B is different from the transistor illustrated in FIGS. 1A to 1C in that the insulators 410a and 410b are not included, and a conductor 413 is provided below the semiconductor 406b with the insulator 402 therebetween. The conductor 413 is placed so as to overlap with the channel formation region of the transistor and has a function as a second gate electrode or a function of controlling the threshold voltage of the transistor. In order to control the threshold voltage of the transistor, a constant potential may be applied to the conductor 413, for example. The on-state current of the transistor can be increased by application of a potential higher than that of a source electrode of the transistor to the conductor 413, for example. Furthermore, the off-state current of the transistor can be decreased by application of a potential lower than that of the source electrode of the transistor to the conductor 413, for example. Thus, the on-state current of the transistor can be increased, and the off-state current of the transistor can be decreased by application of a given potential to the conductor 413. For the conductor 413, refer to the description of the conductor 404, for example.

Figure 3C:
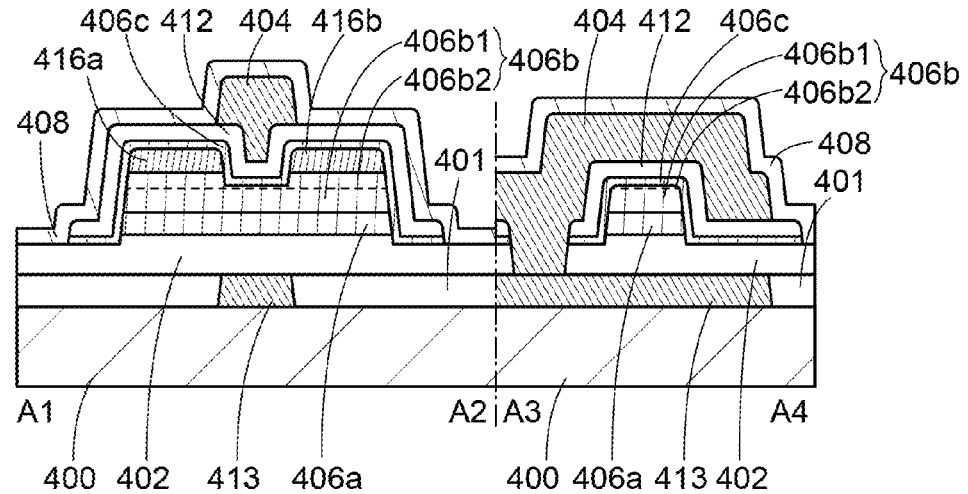

The transistor illustrated in FIG. 3C is different from the transistor illustrated in FIG. 1A to 1C in that the insulators 410a and 410b are not included, the conductor 413 is provided below the semiconductor 406b with the insulator 402 therebetween, and the semiconductor 406c covers the conductors 416a and 416b and the semiconductors 406a and 406b. Furthermore, the transistor illustrated in FIG. 3C is different from the transistor illustrated in FIG. 3B in that the conductor 404 and the conductor 413 are electrically connected to each other. The transistor illustrated in FIG. 3C has a structure in which the channel formation region of the transistor is surrounded also by the conductor 413. Thus, the transistor illustrated in FIG. 3C can have further advantages of the s-channel structure. Furthermore, the semiconductor 406c covers the conductors 416a and 416b and the semiconductors 406a and 406b, so that leakage current generated between the conductors 416a and 416b and the conductor 404 can be reduced.

<Transistor Structure 2>

Figure 4A:
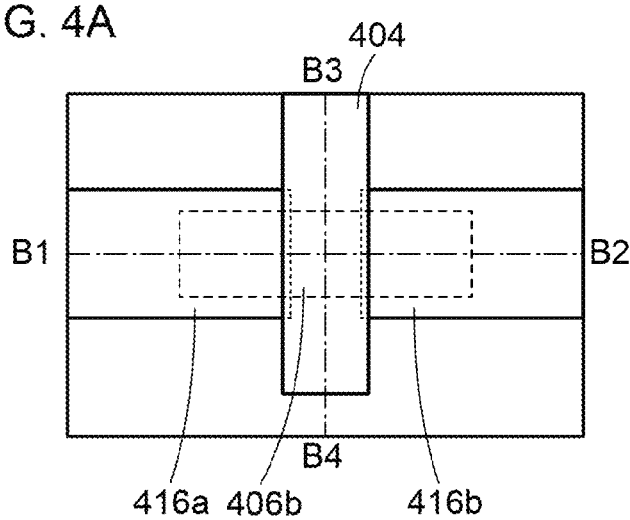
FIGS. 4A and 4B are a top view and a cross-sectional view of a transistor according to one embodiment of the present invention.
Figure 4B:
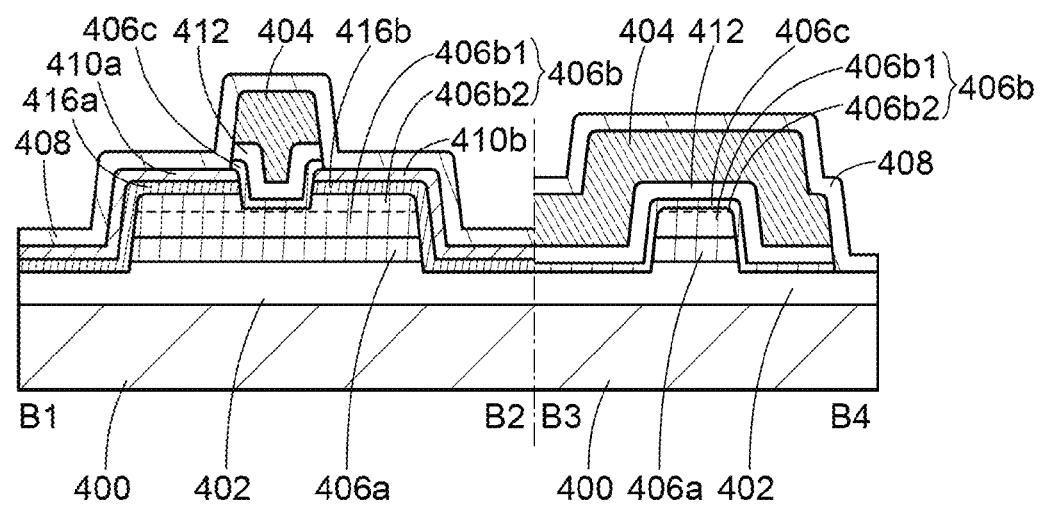

FIGS. 4A and 4B illustrate a transistor according to one embodiment of the present invention. FIG. 4A is a top view of the transistor. FIG. 4B is a cross-sectional view taken along dashed-dotted line B1-B2 and dashed-dotted line B3-B4 in FIG. 4A.

The transistor in FIG. 4B includes the insulator 402 over the substrate 400, the semiconductor 406a over the insulator 402, the semiconductor 406b over the semiconductor 406a, the conductor 416a over the semiconductor 406b, the conductor 416b over the semiconductor 406b, the insulator 410a over the conductor 416a, the insulator 410b over the conductor 416b, the semiconductor 406c over the semiconductor 406b, the insulator 412 over the semiconductor 406c, and the conductor 404 over the insulator 412. The insulator 408 may be placed so as to cover the transistor. The insulator 402 is not necessarily provided. The insulator 410a is not necessarily provided. The insulator 410b is not necessarily provided. The semiconductor 406a is not necessarily provided. The semiconductor 406c is not necessarily provided.

A bottom surface of the conductor 416a is in contact with the side surfaces of the semiconductor 406a and the top surface and the side surfaces of the semiconductor 406b. That is, the conductor 416a has regions in contact with surfaces other than the top surface of the semiconductor 406b (e.g., the side surfaces of the semiconductor 406b). Furthermore, the bottom surface of the conductor 416b is in contact with the side surfaces of the semiconductor 406a, and the top surface and the side surfaces of the semiconductor 406b. That is, the conductor 416b has regions in contact with surfaces other than the top surface of the semiconductor 406b (e.g., the side surfaces of the semiconductor 406b). Thus, the contact resistance between the conductors 416a and 416b and the semiconductor 406b is low. That is, the transistor has high on-state current.

Note that the description on the transistor illustrated in FIGS. 1A to 1C can be referred to for the structures of the other components.

<Modification Example of Transistor Structure 2>

The transistor in FIGS. 4A and 4B can be modified into various modes.

Figure 5A:
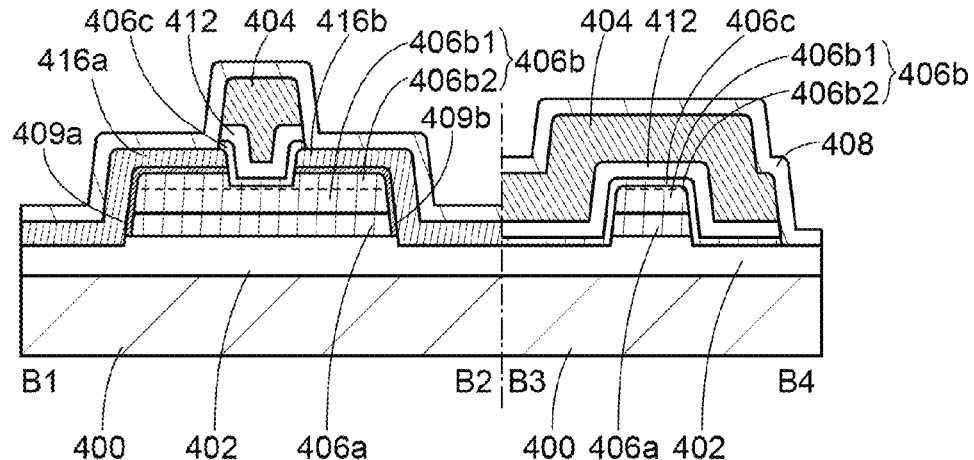
FIGS. 5A to 5C are cross-sectional views each illustrating a transistor according to one embodiment of the present invention.

For example, the transistor in FIG. 5A is different from the transistor in FIGS. 4A and 4B in that the insulators 410a and 410b are not included, and regions 409a and 409b are formed over part of the side surfaces of the semiconductor 406a and part of the top surface and side surfaces of the semiconductor 406b. Note that the regions 409a and 409b are not formed in the channel formation region. The regions 409a and 409b are regions whose resistivity is higher than that of the conductor 416a and/or the conductor 416b and whose resistivity is lower than that of the other region of the semiconductor 406b, for example. Furthermore, the regions 409a and 409b have a function of reducing contact resistance between the conductors 416a and 416b and the semiconductor 406b. As a result, stable electric characteristics in the saturation region of the transistor can be obtained in some cases. Furthermore, the on-state current of a transistor can be increased in some cases. The regions 409a and 409b can be formed, for example, by addition of one or more elements selected from hydrogen, boron, nitrogen, phosphorus, and argon to part of the semiconductors 406a and 406b. Specifically, a trivalent element or a quinquevalent element is preferably added. The addition of the element is performed by plasma treatment or ion implantation treatment.

Figure 5B:
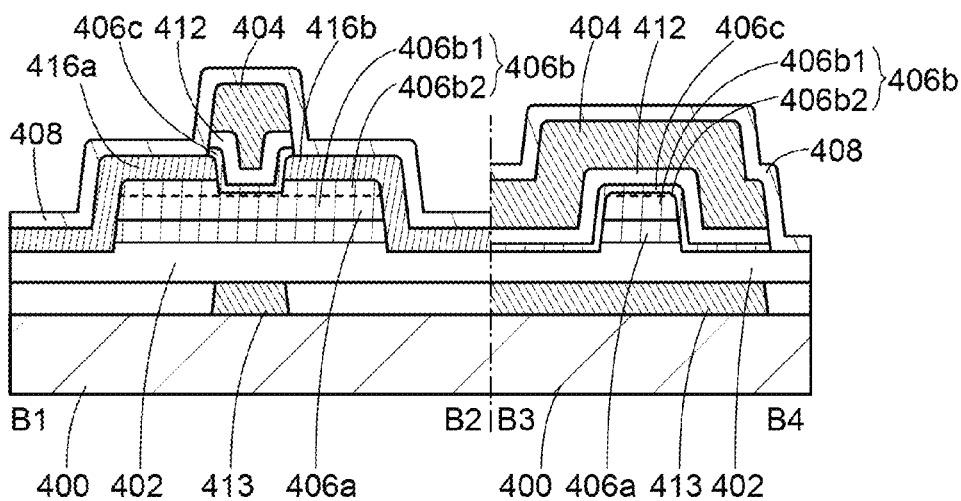

Moreover, the transistor illustrated in FIG. 5B is different from the transistor illustrated in FIGS. 4A and 4B in that the insulators 410a and 410b are not included, and a conductor 413 is provided below the semiconductor 406b with the insulator 402 therebetween. The conductor 413 is placed so as to overlap with the channel formation region of the transistor and has a function as a second gate electrode or a function of controlling the threshold voltage of the transistor. In order to control the threshold voltage of the transistor, a constant potential may be applied to the conductor 413, for example. The on-state current of the transistor can be increased by application of a potential higher than that of a source electrode of the transistor to the conductor 413, for example. Furthermore, the off-state current of the transistor can be decreased by application of a potential lower than that of the source electrode of the transistor to the conductor 413, for example. Thus, the on-state current of the transistor can be increased, and the off-state current of the transistor can be decreased by application of a given potential to the conductor 413. For the conductor 413, refer to the description of the conductor 404, for example.

Figure 5C:
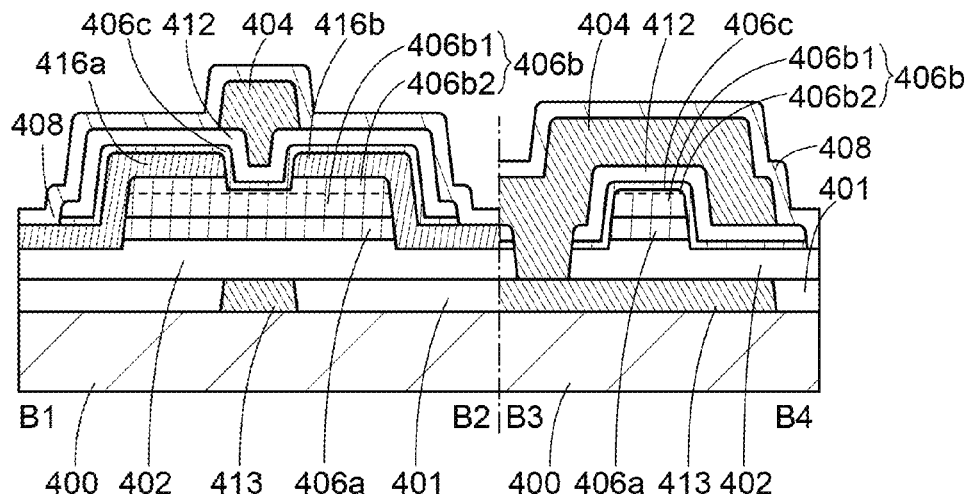

The transistor illustrated in FIG. 5C is different from the transistor illustrated in FIGS. 4A and 4B in that the insulators 410a and 410b are not included, the conductor 413 is provided below the semiconductor 406b with the insulator 402 therebetween, and the semiconductor 406c covers the conductors 416a and 416b and the semiconductors 406a and 406b. Furthermore, the transistor illustrated in FIG. 5C is different from the transistor illustrated in FIG. 5B in that the conductor 404 and the conductor 413 are electrically connected to each other. The transistor illustrated in FIG. 5C has a structure in which the channel formation region of the transistor is surrounded also by the conductor 413. Thus, the transistor illustrated in FIG. 5C has a structure provided with further advantages of the s-channel structure. Furthermore, the semiconductor 406c covers the conductors 416a and 416b and the semiconductors 406a and 406b, so that leakage current generated between the conductors 416a and 416b and the conductor 404 can be reduced.

<Method for Manufacturing Transistor>

A method for manufacturing a transistor of one embodiment of the present invention is described below.

Here, an example of forming a resist that is used to manufacture a transistor of one embodiment of the present invention is described. First, a layer of a photosensitive organic or inorganic substance is formed by a spin coating method or the like. Then, the layer of a photosensitive organic or inorganic substance is irradiated with light using a photomask. As such light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. Alternatively, an electron beam or an ion beam may be used instead of the irradiation of light on the layer of a photosensitive organic or inorganic substance. Note that a photomask is not necessary in the case of using an electron beam or an ion beam. Next, an exposed region of the layer of a photosensitive organic or inorganic substance is removed or left using a developing solution, so that a resist is formed.

Note that in this specification, the case where a resist is formed also includes the case where a bottom antireflective coating (BARC) layer is formed below the resist. When the BARC layer is used, the BARC layer is etched using the resist first. Then, an object to be processed is etched using the resist and the BARC layer. Instead of the BARC layer, an organic or inorganic substance that does not have a function as the BARC layer may be used.

In this specification, in the case of removing the resist, plasma treatment and/or wet etching is used. Note that as the plasma treatment, plasma ashing is preferable. In the case where the removal of the resist and the like is not enough, the remaining resist and the like may be removed using ozone water and/or hydrofluoric acid at a concentration higher than or equal to 0.001 volume % and lower than or equal to 1 volume %, and the like.

In this specification, the conductors, the insulators, and the semiconductors can be deposited by a sputtering method, a chemical vapor deposition (CVD) method, a molecular beam epitaxy (MBE) method, a pulsed laser deposition (PLD) method, an atomic layer deposition (ALD) method, a thermal oxidation method, a plasma oxidation method, or the like.

A CVD method includes a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. A thermal CVD method, which does not use plasma, is a film formation method with less plasma damage to an object of the treatment. For example, a wiring, an electrode, an element (e.g., a transistor or a capacitor), and the like included in a semiconductor device may receive charges from plasma, and charge buildup may occur in some cases. In that case, because of the accumulated charges, the wiring, the electrode, the element, or the like in the semiconductor device may be broken. Such plasma damage does not occur in the case of using a thermal CVD method without using plasma, and thus the yield of a semiconductor device can be increased. In addition, since plasma damage does not occur in the film formation by a thermal CVD method, a film with few defects can be obtained.

In addition, an ALD method is also a film formation method with less plasma damage to an object of the treatment. By using an ALD method, a film with few defects can be obtained since the plasma damage does not occur.

Unlike in a deposition method in which particles ejected from a target or the like are deposited, in a CVD method and an ALD method, a film is formed by reaction at a surface of an object. Therefore, they are film formation methods whereby a film with favorable coverage is formed without being greatly affected by the shape of the object. In particular, a film formed by an ALD method has favorable coverage and excellent uniformity in thickness. Therefore, an ALD method is preferred for forming a film covering a surface of an opening with a high aspect ratio. However, film formation speed of an ALD method is relatively slow, and thus it may be preferable to use an ALD method in combination with another film formation method with high film formation speed such as an CVD method in some cases.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Here, a method for manufacturing the transistor illustrated in FIGS. 1A to 1C will be described with reference to FIGS. 6A to 6C and FIGS. 7A and 7B.

First, the substrate 400 is prepared. Then, the insulator 402 is formed. Next, a semiconductor 436a to be the semiconductor 406a is formed.

Note that the semiconductor 436a is preferably formed so as to include excess oxygen. Alternatively, after the semiconductor 436a is formed, treatment to add oxygen to the semiconductor may be performed. Plasma treatment, ion implantation method, or the like can be used for the treatment to add oxygen.

In the case where oxygen is added to the semiconductor 436a by plasma treatment, for example, plasma is generated using an oxidizing gas such as oxygen, ozone, or nitrous oxide, and the semiconductor 436a is exposed to the plasma. Alternatively, a conductor is formed over the semiconductor 436a, and the semiconductor 436a is exposed to the plasma through the conductor. When the plasma treatment is performed, a bias voltage is preferably applied so that oxygen is drawn to the substrate 400 side. A larger amount of oxygen can be added to the semiconductor 436a by application of the bias voltage. The bias voltage may be a self-bias voltage. It is preferable to perform the plasma treatment with the substrate 400 heated. Heating the substrate 400 enables a large amount of oxygen to be added to the semiconductor 436a. As the conductor, a metal, a transparent conductor, or the like is used, for example. Specifically, titanium nitride, tantalum nitride, an In—Sn oxide, an In—Sn—Si oxide, or an In-M-Zn oxide is preferably used. Specifically, a chemical reaction with an oxidizing gas hardly occurs with the use of an oxide; thus, more oxygen can be added.

Figure 6A:
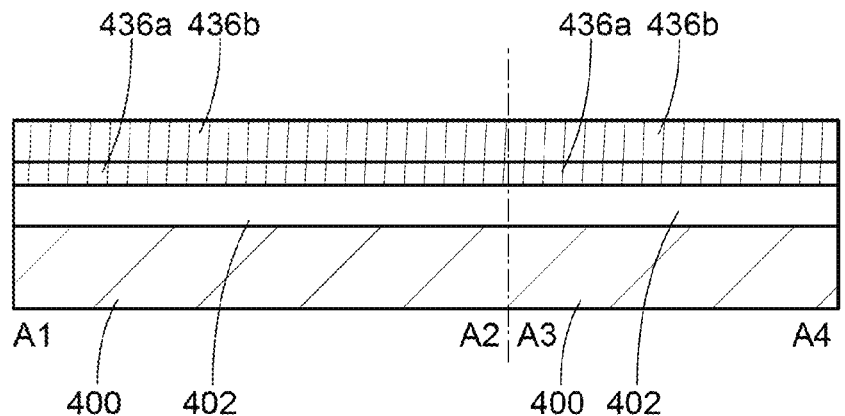
FIGS. 6A to 6C are cross-sectional views illustrating a transistor according to one embodiment of the present invention.
Figure 6B:
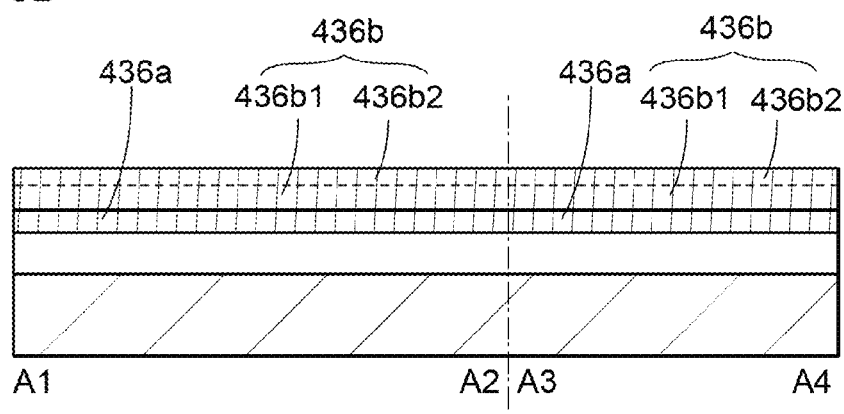
Figure 6C:
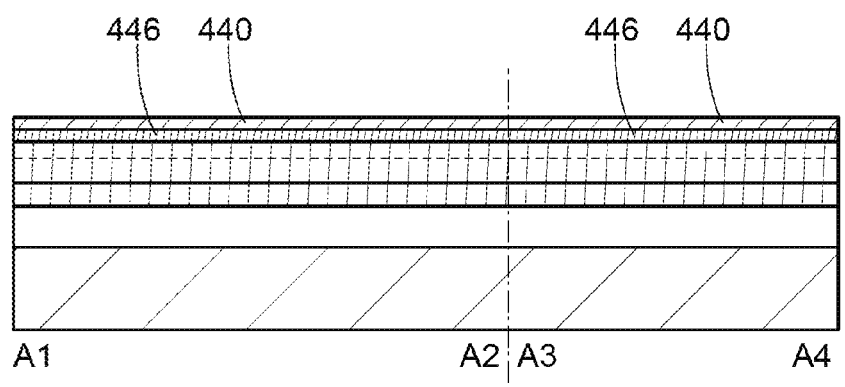

Next, a semiconductor 436b to be the semiconductor 406b is formed (see FIG. 6A).

Next, heat treatment is performed. By the heat treatment, part of excess oxygen in the semiconductor 436a is moved to the semiconductor 436b. Thus, the semiconductor 436b is divided into a layer 436b1 and a layer 436b2 by the mechanism illustrated in FIGS. 2A and 2B and the like (see FIG. 6B). The layer 436b1 becomes the layer 406b1 in a later step. The layer 436b2 becomes the layer 406b2 in a later step.

Next, a conductor 446 to be the conductor 416a and the conductor 416b is formed. Then, an insulator 440 to be the insulator 410a and the insulator 410b is formed (see FIG. 6C).

Next, a resist is formed. The insulator 440 is etched using the resist as a mask, so that an insulator 410 is formed. The conductor 446 is etched using the resist and the insulator 410 as a mask, so that a conductor 416 is formed. The semiconductor 436b is etched using the resist, the insulator 410 and the conductor 416 as masks, so that the semiconductor 406b is formed. When the semiconductor 406b is formed, the layer 436b1 becomes the layer 406b1, and the layer 436b2 becomes the layer 406b2. Furthermore, the semiconductor 436a is etched using the resist, the insulator 410, the conductor 416, and the semiconductor 406b as masks, so that the semiconductor 406a is formed. After that, the resist is removed (see FIG. 7A).

Figure 20A:
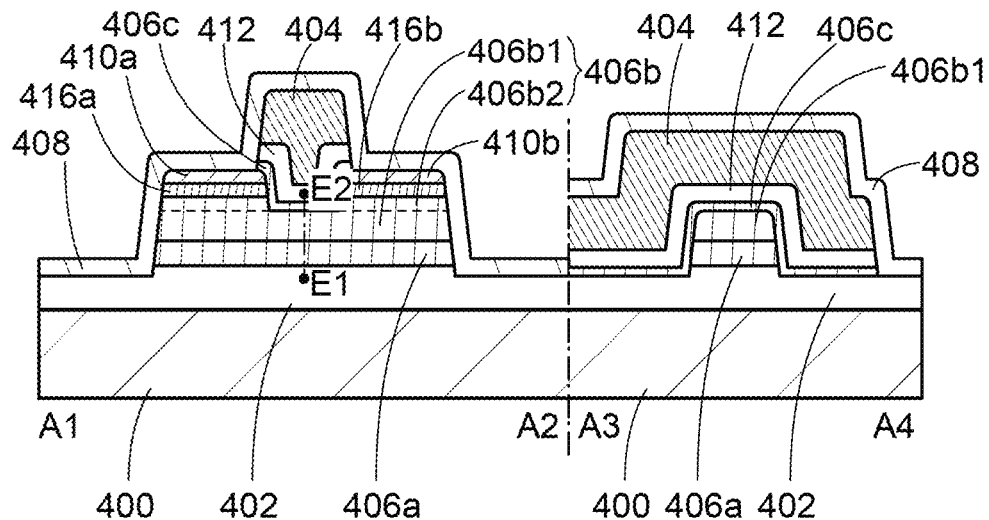
FIGS. 20A and 20B are a cross-sectional view and a band diagram of a transistor according to one embodiment of the present invention.
Figure 20B:
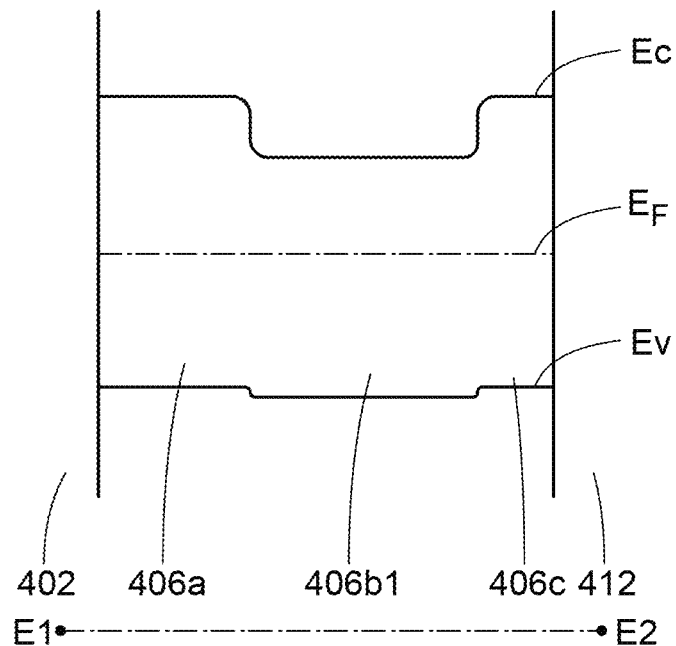

Next, a resist is formed. The insulator 410 is etched using the resist as a mask, whereby the insulators 410a and 410b are formed. The conductor 416 is etched using the resist and the insulators 410a and 410b as masks, whereby the conductors 416a and 416b are formed. Furthermore, part of the semiconductor 406b is etched using the resist, the insulators 410a and 410b, and the conductors 416a and 416b as masks, so that part of the semiconductor 406b is thinned. At this time, the layer 406b2 is etched so that the thickness thereof in the channel formation region is greater than or equal to 1 nm and less than or equal to 10 nm, preferably greater than or equal to 1 nm and less than or equal to 5 nm. Because the layer 406b2 has a region functioning as a channel formation region of the transistor, controllability by an electric field from the gate electrode of the transistor is increased when the layer 406b2 has the above-described thickness. Next, the resist is removed (see FIG. 7B). Note that the layer 406b2 in the channel formation region may be etched completely. In that case, the transistor to be manufactured has the cross-sectional shape illustrated in FIG. 20A. FIG. 20B is a band diagram taken along dashed-dotted line E1-E2 in FIG. 20A. The layer 406b2 is not included in the channel formation region; thus, the threshold voltage of the transistor tends to be positive.

Figure 7A:
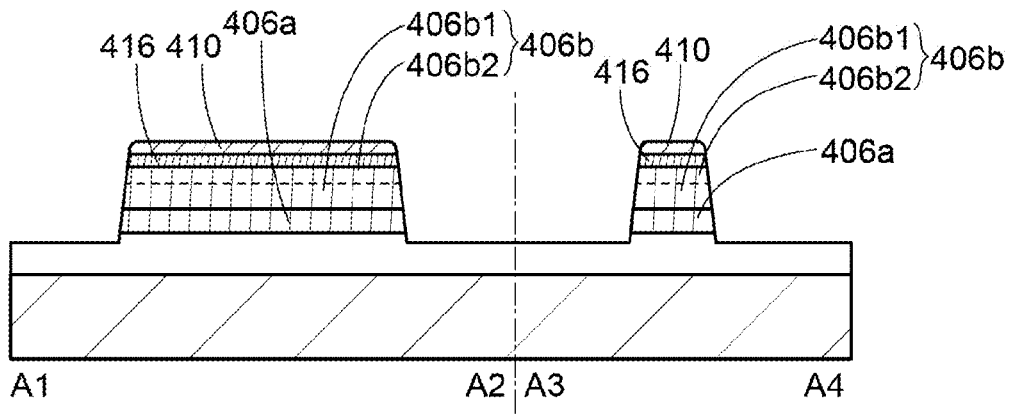
FIGS. 7A to 7C are cross-sectional view illustrating the transistor according to one embodiment of the present invention.
Figure 7B:
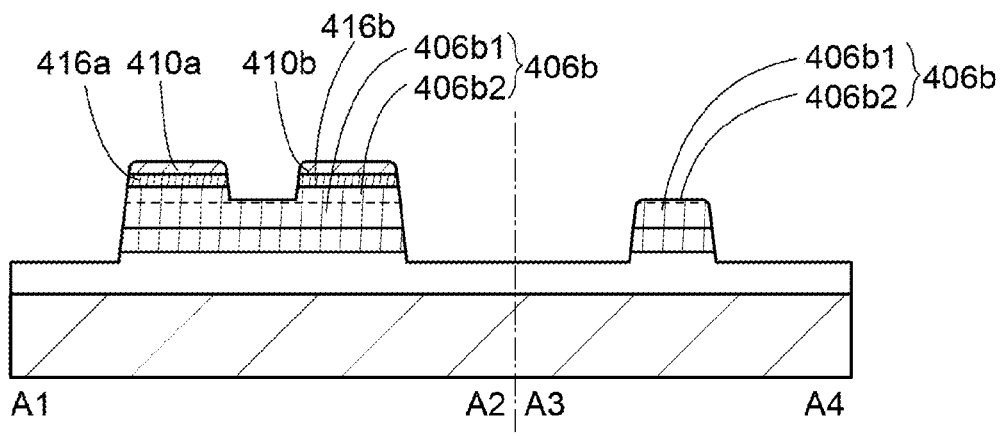
Figure 7C:
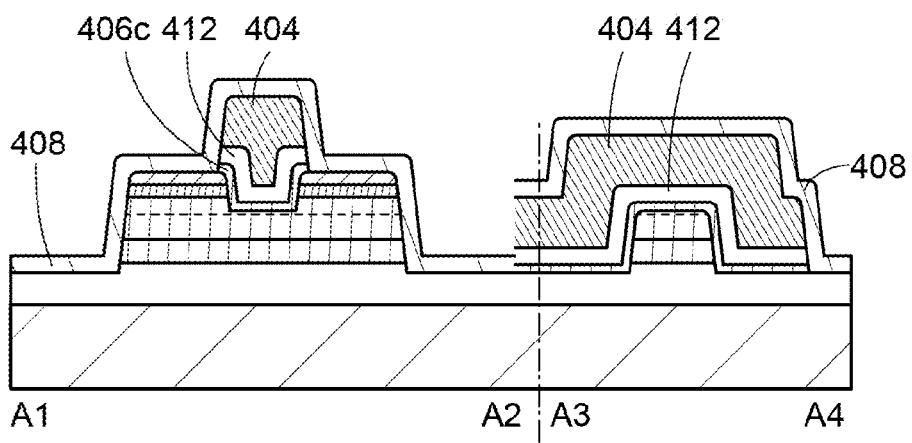

Next, a semiconductor to be the semiconductor 406c is formed. Next, an insulator to be the insulator 412 is formed. Next, a conductor to be the conductor 404 is formed. Next, a resist is formed over the conductor to be the conductor 404. Then, the conductor to be the conductor 404 is etched using the resist as a mask, whereby the conductor 404 is formed. The insulator to be the insulator 412 is etched using the resist and the conductor 404 as masks, whereby the insulator 412 is formed. The semiconductor to be the semiconductor 406c is etched using the resist, the conductor 404, and the insulator 412 as masks, whereby the semiconductor 406c is formed. Next, the resist is removed. Then, the insulator 408 is formed, so that the transistor can be formed (see FIG. 7C). Note that a hard mask may be formed between the conductor to be the conductor 404 and the resist. As the hard mask, for example, a single-layer structure or a stacked-layer structure of tungsten, titanium, tantalum, tungsten nitride, tantalum nitride, titanium nitride, silicon oxide, silicon oxynitride, silicon nitride, silicon nitride oxide, aluminum oxide, or the like may be used.

Through the above steps, the transistor illustrated in FIGS. 1A to 1C can be manufactured.

<Semiconductor Device>

An example of a semiconductor device of one embodiment of the present invention is illustrated below.

<Circuit>

An example of a circuit including a transistor of one embodiment of the present invention is illustrated below.

<CMOS Inverter>

Figure 8A:
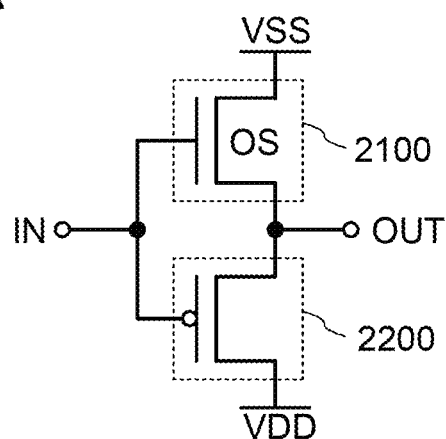
FIGS. 8A and 8B are circuit diagrams of a semiconductor device according to one embodiment of the present invention.

The circuit diagram in FIG. 8A shows a configuration of a so-called CMOS inverter in which a p-channel transistor 2200 and an n-channel transistor 2100 are connected to each other in series and in which gates of them are connected to each other.

<Structure 1 of Semiconductor Device>

Figure 9:
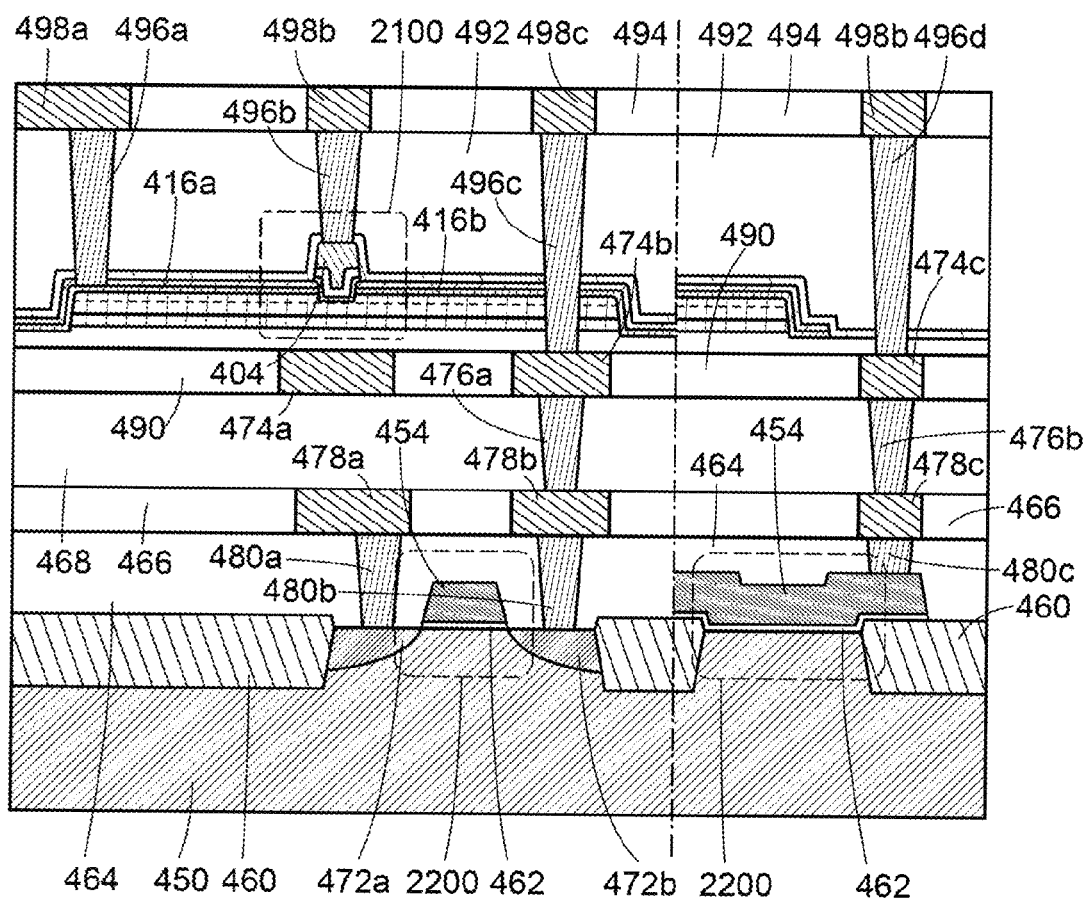
FIG. 9 is a cross-sectional view of a semiconductor device according to one embodiment of the present invention.

FIG. 9 is a cross-sectional view of the semiconductor device of FIG. 8A. The semiconductor device in FIG. 9 includes the transistor 2200 and the transistor 2100. The transistor 2100 is provided over the transistor 2200. Although an example where the transistor illustrated in FIGS. 1A and 1B is used as the transistor 2100 is shown, a semiconductor device of one embodiment of the present invention is not limited thereto. For example, the transistors illustrated in FIGS. 3A to 3C, FIGS. 4A and 4B, and FIGS. 5A to 5C may be used as the transistor 2100. Therefore, the description regarding the above-mentioned transistors is referred to for the transistor 2100 as appropriate.

The transistor 2200 illustrated in FIG. 9 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have a function as a source region and a drain region. The insulator 462 has a function as a gate insulator. The conductor 454 has a function as a gate electrode. Therefore, resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting n-type conductivity is provided in a region where the transistor 2200 is formed. Alternatively, the semiconductor substrate 450 may be an i-type semiconductor substrate.

A top surface of the semiconductor substrate 450 preferably has a (110) plane. Then, on-state characteristics of the transistor 2200 can be improved.

The regions 472a and 472b are regions including impurities imparting p-type conductivity. Accordingly, the transistor 2200 has a structure of a p-channel transistor.

Note that the transistor 2200 is separated from an adjacent transistor by a region 460 and the like. The region 460 is an insulating region.

The semiconductor device illustrated in FIG. 9 includes insulators 464, 466, and 468, conductors 480a, 480b, 480c, 478a, 478b, 478c, 476a, 476b, 474a, 474b, 474c, 496a, 496b, 496c, 496d, 498a, 498b, and 498c, and insulators 490, 492, and 494.

The insulator 464 is provided over the transistor 2200. The insulator 466 is provided over the insulator 464. The insulator 468 is provided over the insulator 466. The insulator 490 is provided over the insulator 468. The transistor 2100 is provided over the insulator 490. The insulator 492 is provided over the transistor 2100. The insulator 494 is provided over the insulator 492. The insulator 466 is over the insulator 464.

The insulator 464 has an opening reaching the region 472a, an opening reaching the region 472b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

In addition, the insulator 468 includes an opening reaching the conductor 478b and an opening reaching the conductor 478c, in which the conductor 476a and the conductor 476b are embedded, respectively.

Furthermore, the insulator 490 includes an opening overlapping with the channel formation region of the transistor 2100, an opening reaching the conductor 476a, and an opening reaching the conductor 476b, in which the conductors 474a, the conductor 474b, and the conductor 474c are embedded, respectively.

The conductor 474a may have a function as a gate electrode of the transistor 2100. Alternatively, for example, electric characteristics such as the threshold voltage of the transistor 2100 may be controlled by application of a constant potential to the conductor 474a. Further alternatively, for example, the conductor 474a and the conductor 404 functioning as the gate electrode of the transistor 2100 may be electrically connected to each other. Thus, the on-state current of the transistor 2100 can be increased. A punch-through phenomenon can be suppressed; thus, stable electric characteristics in the saturation region of the transistor 2100 can be obtained.

The insulator 492 includes an opening reaching the conductor 474b through the conductor 416b that is one of a source electrode and a drain electrode of the transistor 2100, an opening reaching the conductor 416a that is the other of the source electrode and the drain electrode of the transistor 2100, an opening reaching the conductor 404 that is the gate electrode of the transistor 2100, and an opening reaching the conductor 474c, in which the conductor 496a, the conductor 496b, the conductor 496c, and the conductor 496d are embedded, respectively. Note that in some cases, an opening provided in a component of the transistor 2100 or the like is through other components.

The insulator 494 includes an opening reaching the conductor 496a, an opening reaching the conductors 496b and 496d, and an opening reaching the conductor 496c, in which the conductors 498a 498b, and 498c are embedded, respectively.

The insulators 464, 466, 468, 490, 492, and 494 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

At least one of the insulators 464, 466, 468, 490, 492, and 494 preferably has a function of blocking oxygen and impurities such as hydrogen. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

The conductors 480a, 480b, 480c, 478a, 478b, 478c, 476a, 476b, 474a, 474b, 474c, 496a, 496b, 496c, 496d, 498a, 498b, and 498c may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 10:
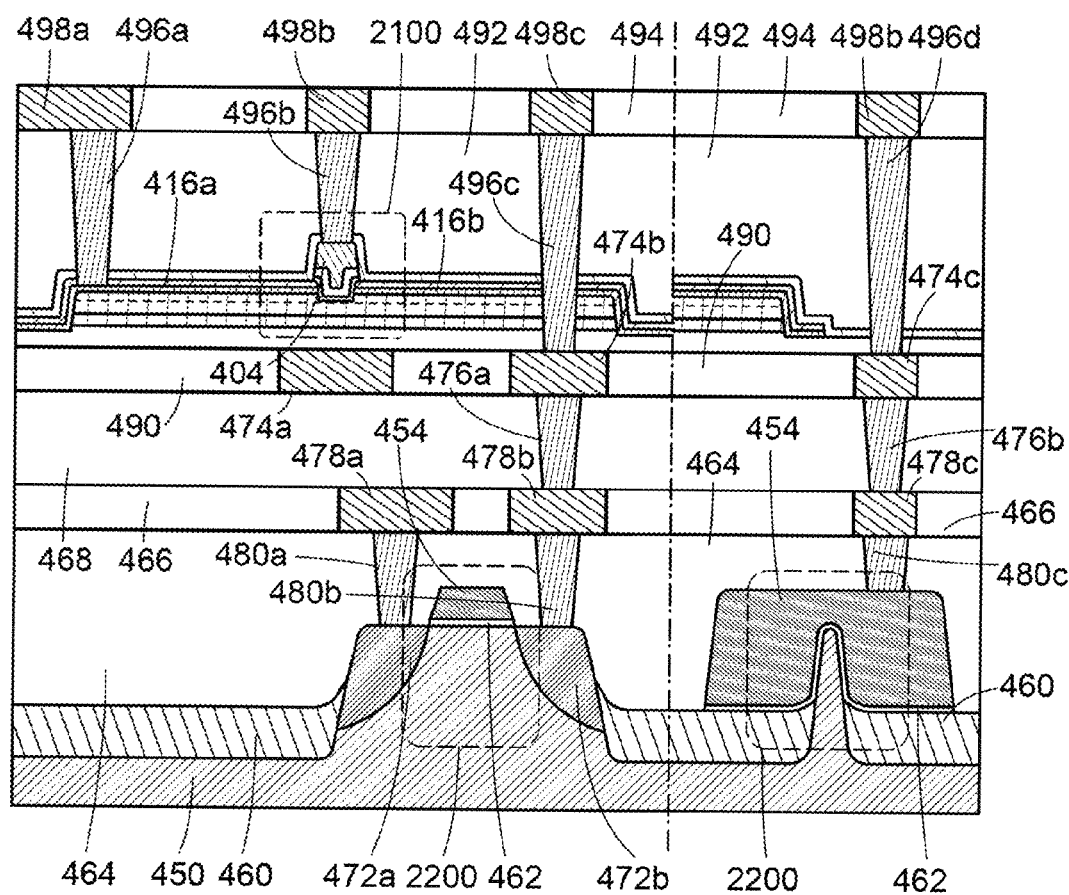
FIG. 10 is a cross-sectional view of a semiconductor device according to one embodiment of the present invention.

Note that a semiconductor device in FIG. 10 is the same as the semiconductor device in FIG. 9 except a structure of the transistor 2200. Therefore, the description of the semiconductor device in FIG. 9 is referred to for the semiconductor device in FIG. 10. In the semiconductor device in FIG. 10, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 11:
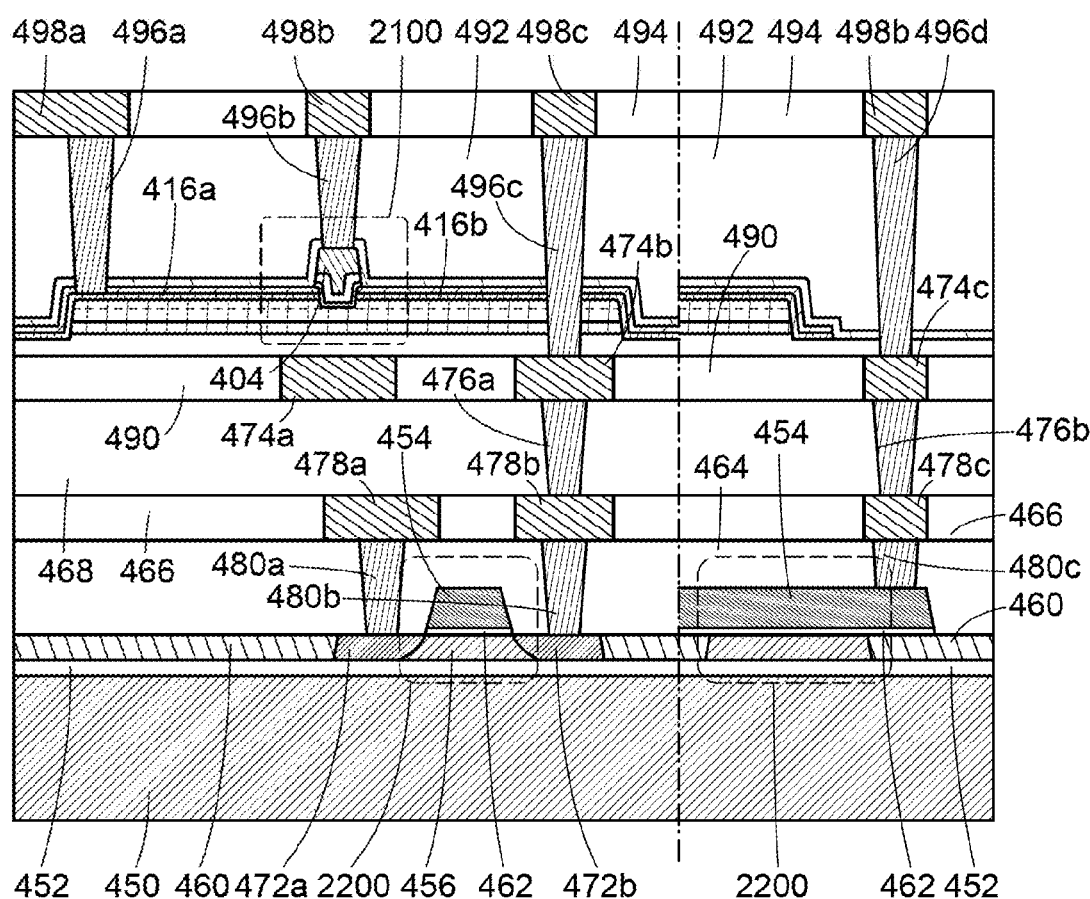
FIG. 11 is a cross-sectional view of a semiconductor device according to one embodiment of the present invention.

Note that a semiconductor device in FIG. 11 is the same as the semiconductor device in FIG. 9 except a structure of the transistor 2200. Therefore, the description of the semiconductor device in FIG. 11 is referred to for the semiconductor device in FIG. 9. In the semiconductor device in FIG. 11, the transistor 2200 is formed using an SOI substrate. In the structure in FIG. 11, a region 456 is separated from the semiconductor substrate 450 with an insulator 452 therebetween. Since the SOI substrate is used, a punch-through phenomenon can be suppressed; and thus the off-state characteristics of the transistor 2200 can be improved. Note that the insulator 452 can be formed by turning part of the semiconductor substrate 450 into an insulator. For example, silicon oxide can be used as the insulator 452.

In each of the semiconductor devices shown in FIG. 9, FIG. 10, and FIG. 11, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device in FIG. 9, FIG. 10, or FIG. 11 can be increased in some cases, compared to a semiconductor device where an n-channel transistor is formed utilizing the semiconductor substrate.

<CMOS Analog Switch>

Figure 8B:
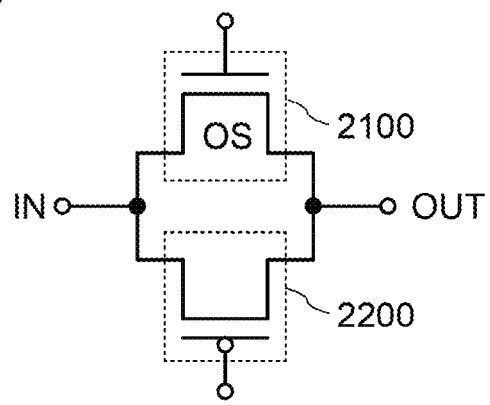

A circuit diagram in FIG. 8B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 12A:
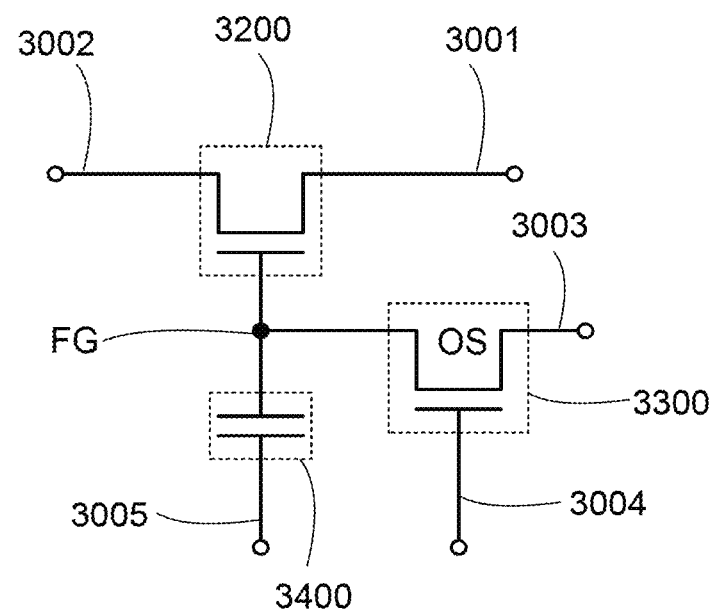
FIGS. 12A and 12B are circuit diagrams of a memory device according to one embodiment of the present invention.
Figure 12B:
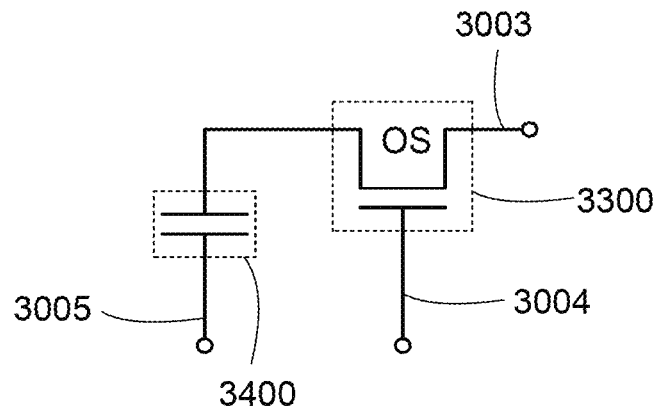

An example of a semiconductor device (memory device) which includes the transistor of one embodiment of the present invention, which can retain stored data even when not powered, and which has an unlimited number of write cycles is shown in FIGS. 12A and 12B.

The semiconductor device illustrated in FIG. 12A includes a transistor 3200 using a first semiconductor, a transistor 3300 using a second semiconductor, and a capacitor 3400. Note that any of the above-described transistors can be used as the transistor 3300.

The transistor 3300 is preferably a transistor with low off-state current. For example, A transistor including an oxide semiconductor can be used as the transistor 3300, for example. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 12A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 12A is capable of retaining the potential of the gate of the transistor 3200, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

<Structure 2 of Semiconductor Device>

Figure 13:
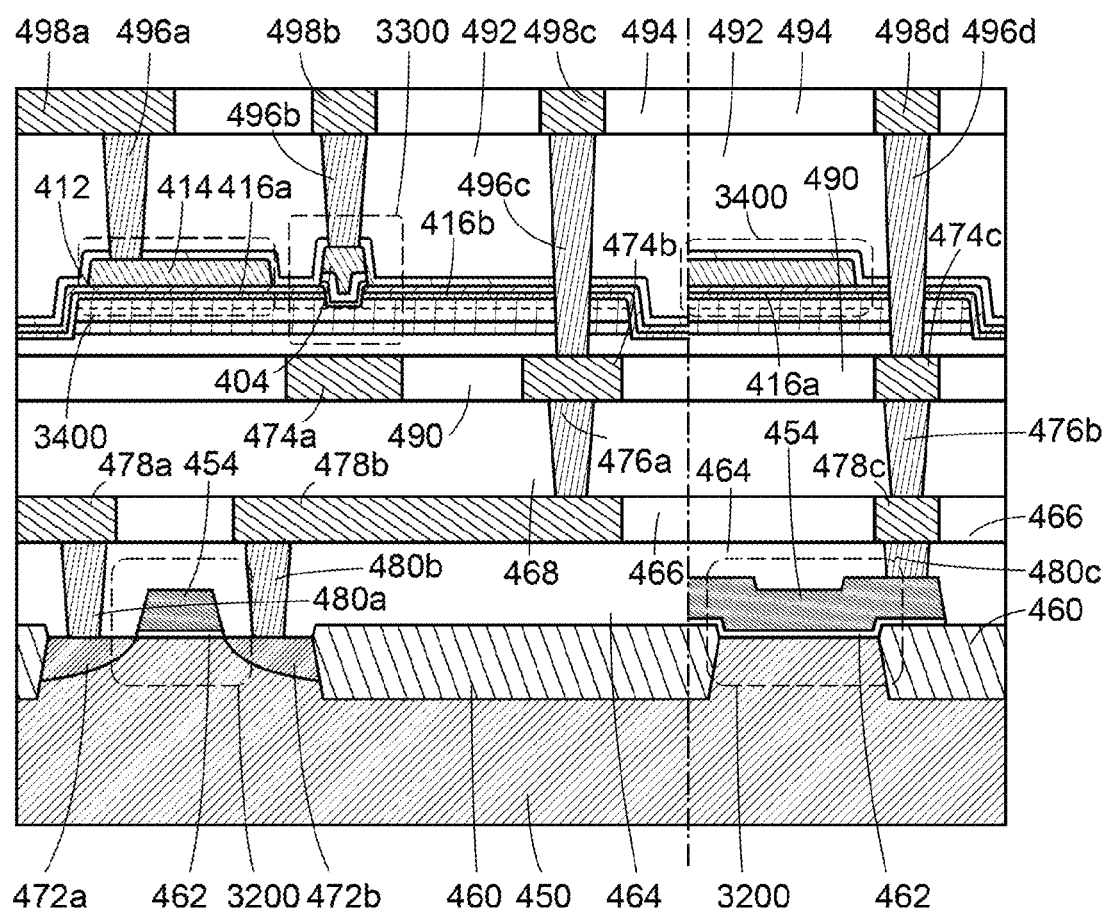
FIG. 13 is a cross-sectional view of a semiconductor device according to one embodiment of the present invention.

FIG. 13 is a cross-sectional view of the semiconductor device of FIG. 12A. The semiconductor device in FIG. 13 includes the transistor 3200, the transistor 3300, and the capacitor 3400. The transistor 3300 and the capacitor 3400 are provided over the transistor 3200. The description of the transistor 2100 is referred to for the transistor 3300. The description of the transistor 2200 in FIG. 9 is referred to for the transistor 3200. Although the case where the transistor 2200 is a p-channel transistor is described in FIG. 9, the transistor 3200 may be an n-channel transistor.

The transistor 3200 shown in FIG. 13 is a transistor using a semiconductor substrate 450. The transistor 3200 includes a region 472a in the semiconductor substrate 450, a region 472b in the semiconductor substrate 450, an insulator 462, and a conductor 454.

The semiconductor device illustrated in FIG. 13 includes insulators 464, 466, and 468, conductors 480a, 480b, 480c, 478a, 478b, 478c, 476a, 476b, 474a, 474b, 474c, 496a, 496b, 496c, 496d, 498a, 498b, 498c, and 498d, and insulators 490, 492, and 494.

The insulator 464 is provided over the transistor 3200. The insulator 466 is provided over the insulator 464. The insulator 468 is provided over the insulator 466. The insulator 490 is provided over the insulator 468. The transistor 3300 is provided over the insulator 490. The insulator 492 is provided over the transistor 3300. The insulator 494 is provided over the insulator 492.

The insulator 464 includes an opening reaching the region 472a, an opening reaching the region 472b, and an opening reaching the conductor 454, in which the conductors 480a 480b, and 480c are embedded, respectively.

The insulator 466 includes an opening reaching the conductor 480a, an opening reaching the conductor 480b, and an opening reaching the conductor 480c, in which the conductors 478a 478b, and 478c are embedded, respectively.

Furthermore, the insulator 468 includes an opening reaching the conductor 478b, and an opening reaching the conductor 478c, in which the conductors 476a and 476b are embedded, respectively.

Furthermore, the insulator 490 includes an opening overlapping with a channel formation region of the transistor 3300, an opening reaching the conductor 476a, and an opening reaching the conductor 476b, in which the conductors 474a, the conductor 474b, and the conductor 474c are embedded, respectively.

The conductor 474a may have a function as a bottom-gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 404 functioning as a top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 492 includes an opening reaching the conductor 474b through the conductor 416b that is one of a source electrode and a drain electrode of the transistor 3300, an opening reaching a conductor 414 which overlaps with the conductor 416a that is the other of the source electrode and the drain electrode of the transistor 3300 with the insulator 412 provided therebetween, an opening reaching the conductor 404 that is the gate electrode of the transistor 3300, and an opening reaching the conductor 474c through the conductor 416a that is the other of the source electrode and the drain electrode of the transistor 3300, in which the conductors 496a, the conductor 496b, the conductor 496c, and the conductor 496d are embedded, respectively. Note that in some cases, an opening provided in a component of the transistor 3300 or the like is positioned through other components.

The insulator 494 includes an opening reaching the conductor 496a, an opening reaching the conductor 496b, an opening reaching the conductor 496c, and an opening reaching the conductor 496d, in which the conductors 498a 498b, 498c, and 498d are embedded, respectively.

At least one of the insulators 464, 466, 468, 490, 492, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The conductor 498d may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

One of the source and the drain of the transistor 3200 is electrically connected to the conductor 416b that is one of the source electrode and the drain electrode of the transistor 3300 through the conductors 480b, 478b, 476a, 474b, and 496c. Furthermore, the conductor 454 that is the gate electrode of the transistor 3200 is electrically connected to the conductor 416b that is the other of the source electrode and the drain electrode of the transistor 3300 through the conductors 480c, 478c, 476b, 474c, and 496d.

The capacitor 3400 includes an electrode electrically connected to the other of the source electrode and the drain electrode of the transistor 3300, the conductor 414, and the insulator 412. Note that the insulator 412 can be formed through the same process as the gate insulator of the transistor 3300; thus, productivity can be preferably increased in some cases. Furthermore, when a layer formed in the same process as the gate electrode of the transistor 3300 is used as the conductor 414, productivity can be preferably improved in some cases.

Note that the description of the transistor illustrated in FIG. 9 can be referred to for the structures of the other components.

Figure 14:
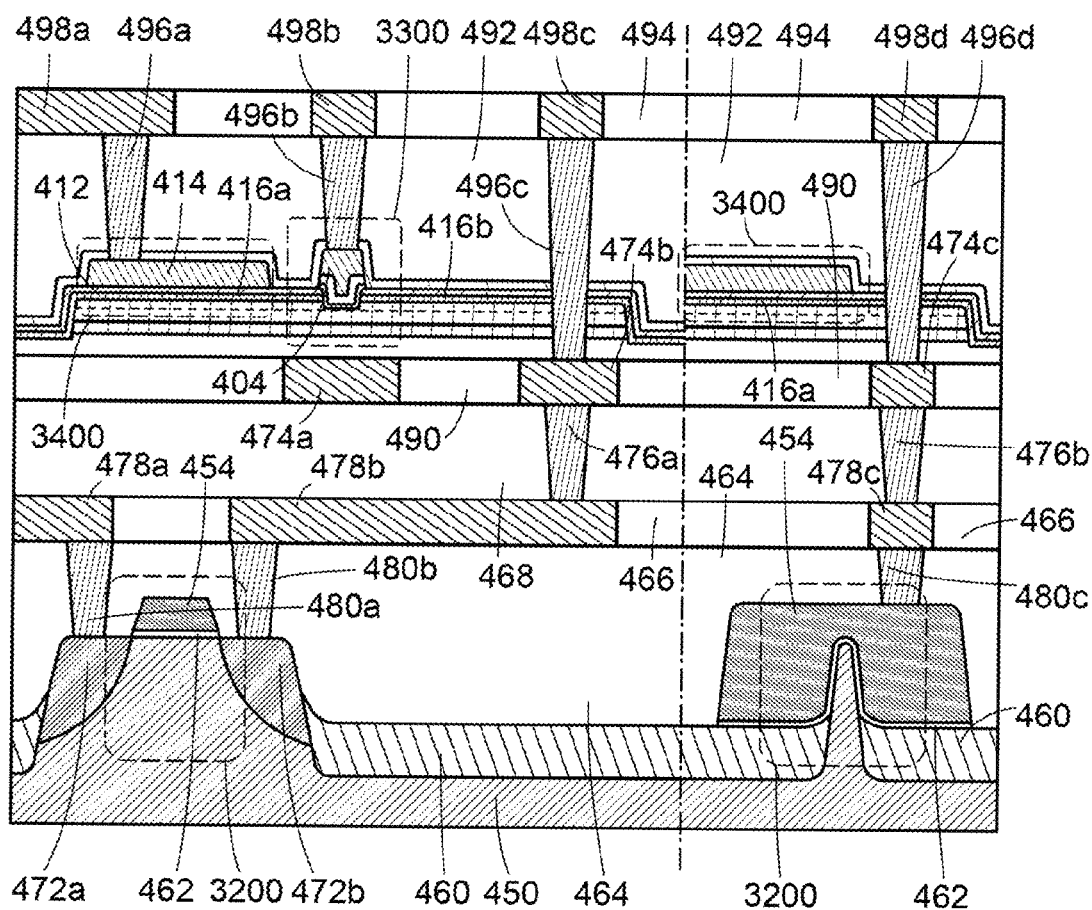
FIG. 14 is a cross-sectional view of a semiconductor device according to one embodiment of the present invention.

Note that a semiconductor device in FIG. 14 is the same as the semiconductor device in FIG. 13 except a structure of the transistor 3200. Therefore, the description of the semiconductor device in FIG. 13 is referred to for the semiconductor device in FIG. 14. In the semiconductor device in FIG. 14, the transistor 3200 is a Fin-type transistor. The description of the transistor 2200 in FIG. 10 is referred to for the transistor 3200 that is a Fin-type transistor. Although the case where the transistor 2200 is a p-channel transistor is described in FIG. 10, the first transistor 3200 may be an n-channel transistor.

Figure 15:
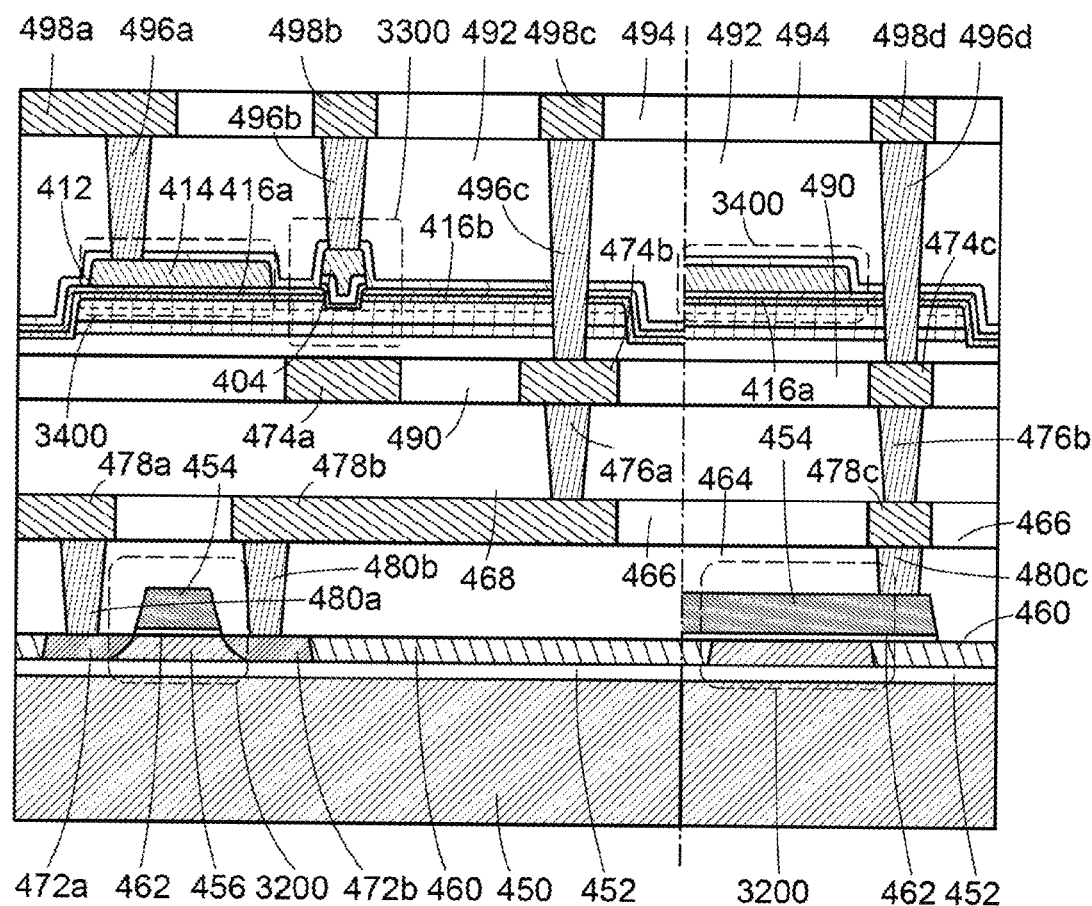
FIG. 15 is a cross-sectional view of a semiconductor device according to one embodiment of the present invention.

Note that a semiconductor device in FIG. 15 is the same as the semiconductor device in FIG. 13 except a structure of the transistor 3200. Therefore, the description of the semiconductor device in FIG. 13 is referred to for the semiconductor device in FIG. 15. Specifically, in the semiconductor device in FIG. 15, the transistor 3200 is provided over the semiconductor substrate 450 that is an SOI substrate. The description of the transistor 2200 in FIG. 11 is referred to for the transistor 3200 provided over the semiconductor substrate 450 that is an SOI substrate. Although the case where the transistor 2200 is a p-channel transistor is described in FIG. 11, the first transistor 3200 may be an n-channel transistor.

<Memory Device 2>

The semiconductor device in FIG. 12B is different from the semiconductor device in FIG. 12A in that the transistor 3200 is not provided. Also in this case, writing and retaining operation of data can be performed in a manner similar to the semiconductor device in FIG. 12A.

Reading of data in the semiconductor device in FIG. 12B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ $(=(C_B \times V_{B0} + C \times V_1)/(C_B + C))$ is higher than the potential of the third wiring 3003 in the case of retaining the potential $V_0$ $(=(C_B \times V_{B0} + C \times V_0)/(C_B + C))$.

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<CPU>

A CPU including a semiconductor device such as any of the above-described transistors or the above-described memory device is described below.

Figure 16:
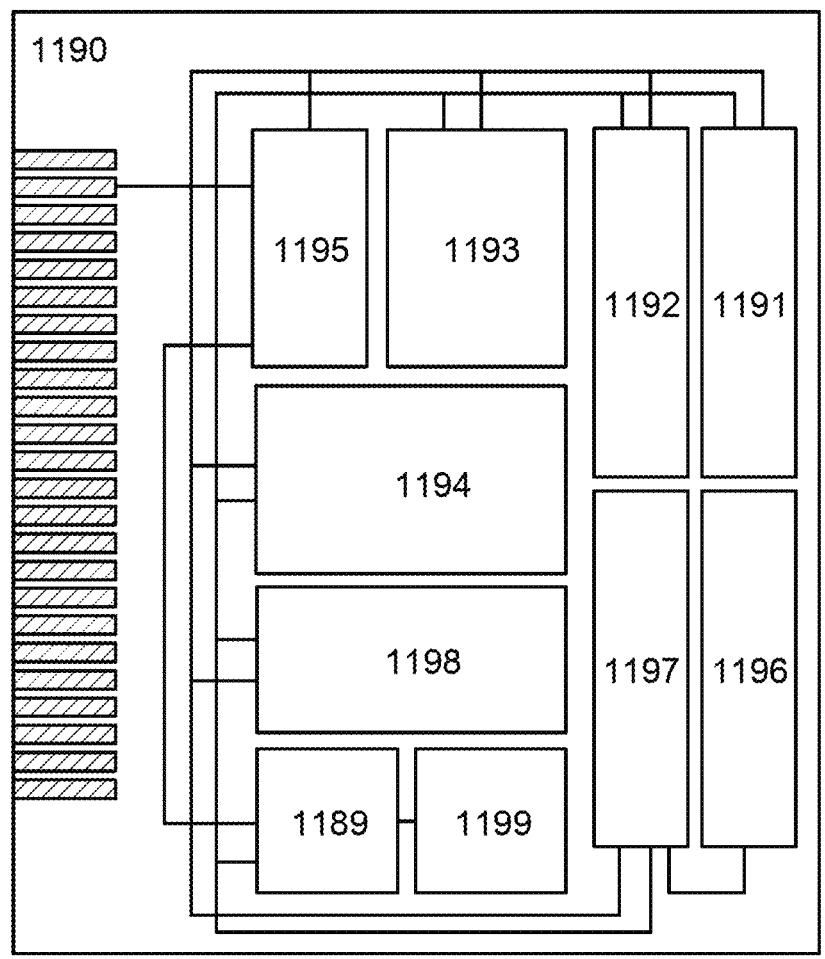
FIG. 16 is a block diagram illustrating a CPU of one embodiment of the present invention.

FIG. 16 is a block diagram illustrating a configuration example of a CPU including any of the above-described transistors as a component.

The CPU illustrated in FIG. 16 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Obviously, the CPU illustrated in FIG. 16 is only an example in which the structure is simplified, and a variety of structures can be applied to an actual CPU depending on the application. For example, the CPU may have the following configuration: a structure including the CPU illustrated in FIG. 16 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU in FIG. 16, a memory cell is provided in the register 1196. For the memory cell of the register 1196, any of the above-described transistors, the above-described memory device, or the like can be used.

In the CPU illustrated in FIG. 16A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 17:
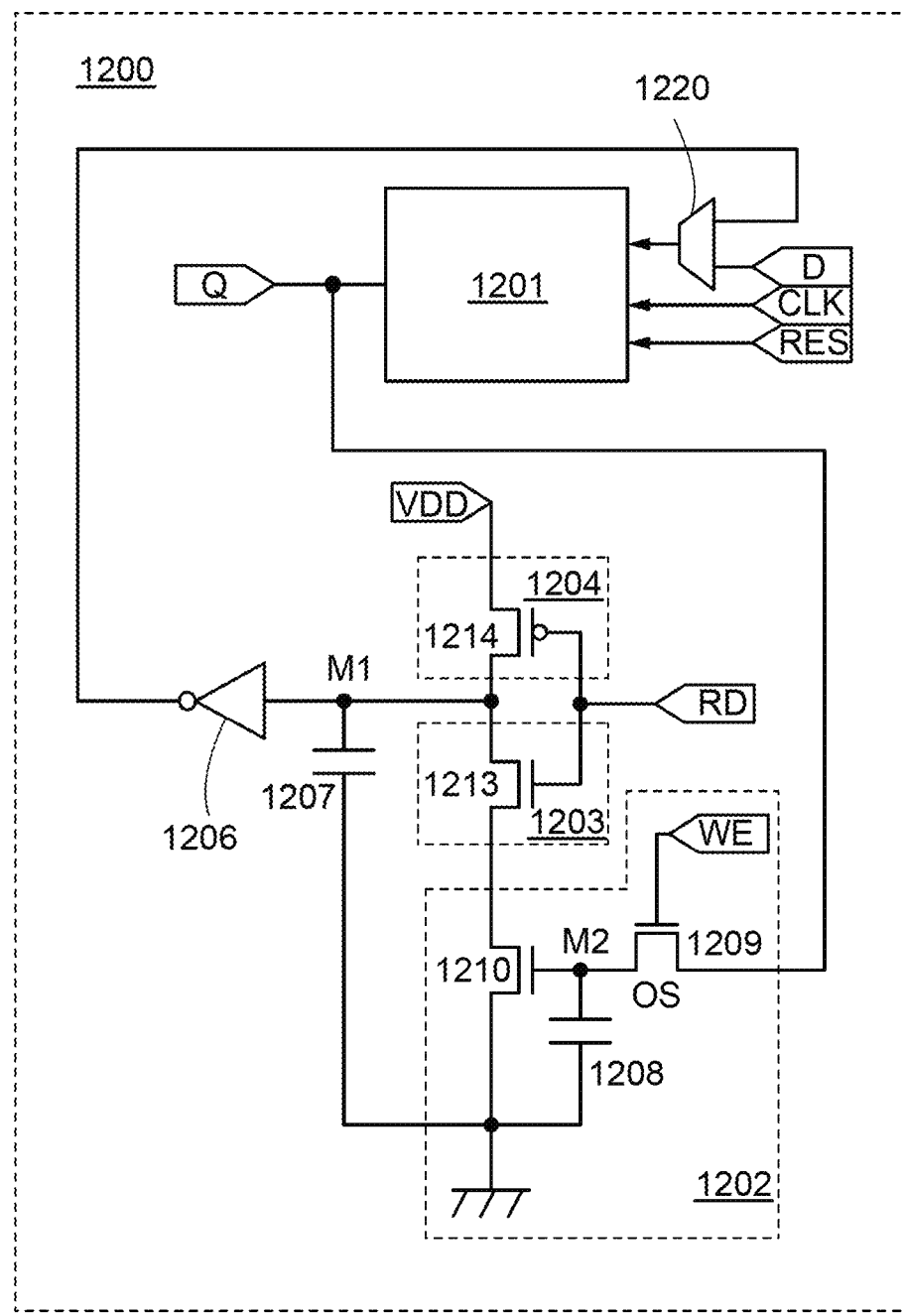
FIG. 17 is a circuit diagram of a memory element according to one embodiment of the present invention.

FIG. 17 is an example of a circuit diagram of a memory element 1200 that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 17 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 17, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 17, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 17, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

Configuration Example

Figure 18A:
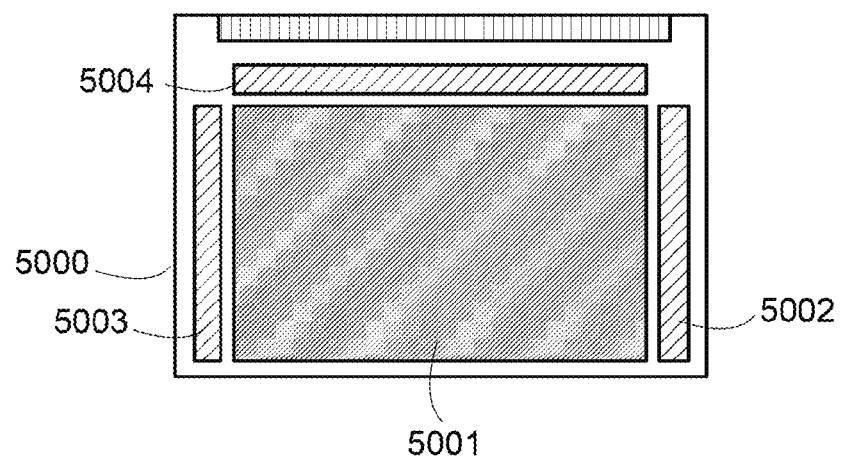
FIGS. 18A to 18C are circuit diagrams of a display device according to one embodiment of the present invention.
Figure 18B:
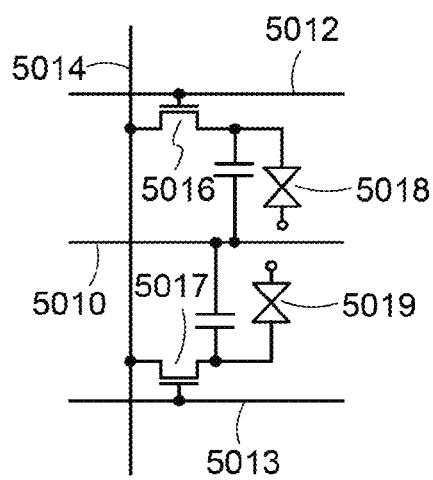
Figure 18C:
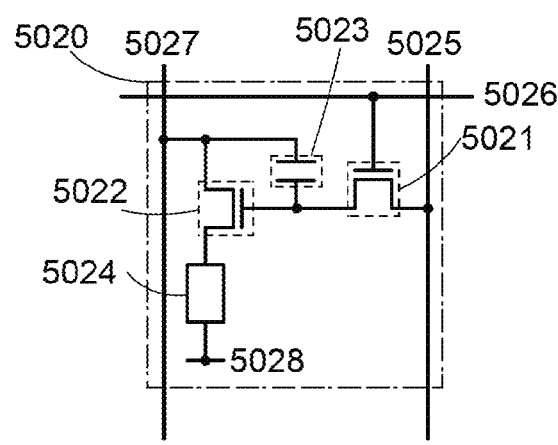

FIG. 18A is a top view of a display device of one embodiment of the present invention. FIG. 18B illustrates a pixel circuit where a liquid crystal element is used for a pixel of a display device of one embodiment of the present invention. FIG. 18C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 18A illustrates an example of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, the display device can be manufactured at cost lower than that in the case where a driver circuit is separately formed. Further, in the case where a driver circuit is separately formed, the number of line connections is increased. By providing the driver circuit over the substrate 5000, the number of line connections can be reduced. Accordingly, the reliability and/or yield can be improved.

[Liquid Crystal Display Device]

FIG. 18B illustrates an example of a circuit configuration of the pixel. Here, a pixel circuit which is applicable to a pixel of a VA liquid crystal display device or the like is illustrated.

This pixel circuit can be used for a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A scan line 5012 of a transistor 5016 and a scan line 5013 of a transistor 5017 are separated so that different gate signals can be supplied thereto. In contrast, a signal line 5014 functioning as a data line is shared by the transistors 5016 and 5017. Any of the above-described transistors can be used as appropriate as each of the transistors 5016 and 5017. Thus, the liquid crystal display device can have high display quality and/or high reliability.

A first pixel electrode is electrically connected to the transistor 5016 and a second pixel electrode is electrically connected to the transistor 5017. The first pixel electrode and the second pixel electrode are separated. There is no specific limitation on the shapes of the first electrode and the second electrode. For example, the first pixel electrode has a V shape.

A gate electrode of the transistor 5016 is electrically connected to the scan line 5012, and a gate electrode of the transistor 5017 is electrically connected to the scan line 5013. When different gate signals are supplied to the scan line 5012 and the scan line 5013, operation timings of the transistor 5016 and the transistor 5017 can be varied. As a result, alignment of liquid crystals can be controlled.

Furthermore, a capacitor may be formed using a capacitor line 5010, a gate insulator functioning as a dielectric, and a capacitor electrode electrically connected to the first pixel electrode or the second pixel electrode.

The pixel structure is a multi-domain structure in which a first liquid crystal element 5018 and a second liquid crystal element 5019 are provided in one pixel. The first liquid crystal element 5018 includes the first pixel electrode, a counter electrode, and a liquid crystal layer therebetween.

The second liquid crystal element 5019 includes the second pixel electrode, the counter electrode, and the liquid crystal layer therebetween.

Note that a pixel circuit in the display device of one embodiment of the present invention is not limited to that shown in FIG. 18B. For example, a switch, a resistor, a capacitor, a transistor, a sensor, a logic circuit, or the like may be added to the pixel circuit shown in FIG. 18B.

[Organic EL Display Device]

FIG. 18C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 18C illustrates an applicable example of a pixel circuit. Here, one pixel includes two n-channel transistors. Note that any of the above-described transistors can be used as the n-channel transistors. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 18C. For example, a switch, a resistor, a capacitor, a sensor, a transistor, a logic circuit, or the like may be added to the pixel circuit shown in FIG. 18C.

In the case where any of the above-described transistors is used for the circuit shown in FIGS. 18A to 18C, the source electrode (the first electrode) is electrically connected to the low potential side and the drain electrode (the second electrode) is electrically connected to the high potential side. Further, the potential of the first gate electrode may be controlled by a control circuit or the like and the potential described above as an example, e.g., a potential lower than the potential applied to the source electrode, may be input to the second gate electrode.

<Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such electronic devices are shown in FIGS. 19A to 19F.

Figure 19A:
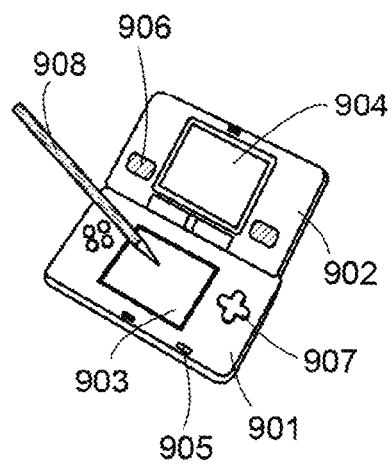
FIGS. 19A to 19F are diagrams illustrating electronic devices of one embodiment of the present invention.

FIG. 19A illustrates a portable game console including a housing 901, a housing 902, a display portion 903, a display portion 904, a microphone 905, speakers 906, an operation key 907, a stylus 908, and the like. Although the portable game machine in FIG. 19A has the two display portions 903 and 904, the number of display portions included in a portable game machine is not limited to this.

Figure 19B:
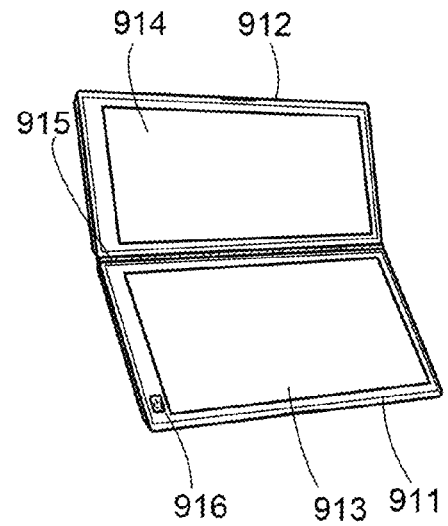

FIG. 19B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 19C:
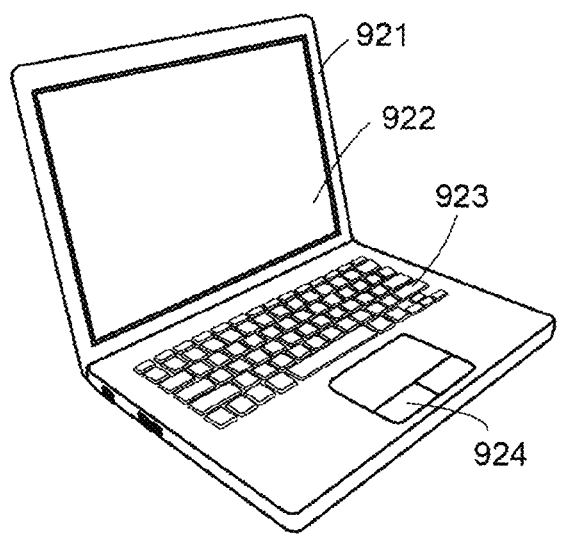

FIG. 19C illustrates a notebook personal computer, which includes a housing 921, a display portion 922, a keyboard 923, a pointing device 924, and the like.

Figure 19D:
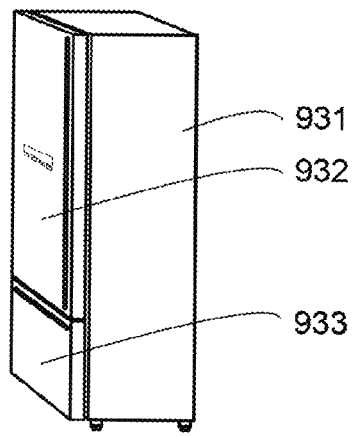

FIG. 19D illustrates the electric refrigerator-freezer including a housing 931, a door for a refrigerator 932, a door for a freezer 933, and the like.

Figure 19E:
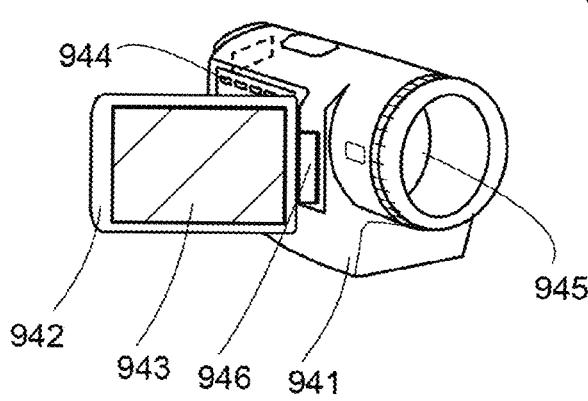

FIG. 19E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 19F:
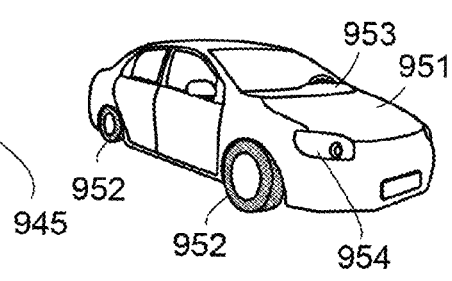

FIG. 19F illustrates an ordinary vehicle including a car body 951, wheels 952, a dashboard 953, lights 954, and the like.

REFERENCE NUMERALS

400: substrate, 401: insulator, 402: insulator, 404: conductor, 406a: semiconductor, 406b: semiconductor, 406b1: layer, 406b2: layer, 406c: semiconductor, 408: insulator, 409a: region, 409b: region, 410: insulator, 410a: insulator, 410b: insulator, 412: insulator, 413: conductor, 414: conductor, 416: conductor, 416a: conductor, 416b: conductor, 436a: semiconductor, 436b: semiconductor, 436b1: layer, 436b2: layer, 440: insulator, 446: conductor, 450: semiconductor substrate, 452: insulator, 454: conductor, 456: region, 460: region, 462: insulator, 464: insulator, 466: insulator, 468: insulator, 472a: region, 472b: region, 474a: conductor, 474b: conductor, 474c: conductor, 476a: conductor, 476b: conductor, 478a: conductor, 478b: conductor, 478c: conductor, 480a: conductor, 480b: conductor, 480c: conductor, 490: insulator, 492: insulator, 494: insulator, 496a: conductor, 496b: conductor, 496c: conductor, 496d: conductor, 498a: conductor, 498b: conductor, 498c: conductor, 498d: conductor, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, 5000: substrate, 5001: pixel portion, 5002: scan line driver circuit, 5003: scan line driver circuit, 5004: signal line driver circuit, 5010: capacitor line, 5012: scan line, 5013: scan line, 5014: signal line, 5016: transistor, 5017: transistor, 5018: liquid crystal element, 5019: liquid crystal element, 5020: pixel, 5021: switching transistor, 5022: driver transistor, 5023: capacitor, 5024: light-emitting element, 5025: signal line, 5026: scan line, 5027: power supply line, 5028: common electrode, 5100: pellet, 5120: substrate, 5161: region.

This application is based on Japanese Patent Application serial No. 2014-112242 filed with Japan Patent Office on May 30, 2014, the entire contents of which are hereby incorporated by reference.

The invention claimed is:

1. A semiconductor device comprising:
a first insulator;
a second insulator;
a first oxide semiconductor;
a second oxide semiconductor;
a first conductor; and
a second conductor,
wherein the first oxide semiconductor is over the first insulator,
wherein the second oxide semiconductor is over the first oxide semiconductor,
wherein the first conductor comprises a region in contact with a top surface of the second oxide semiconductor,
wherein the second insulator is over the second oxide semiconductor,
wherein the second conductor is over the second oxide semiconductor with the second insulator therebetween,
wherein the second oxide semiconductor comprises a first layer and a second layer,
wherein the first layer comprises a region in contact with the first oxide semiconductor,
wherein the second layer is over and in contact with the first layer, and
wherein the first layer has a lower proportion of oxygen vacancies than the second layer.

2. The semiconductor device according to claim 1, further comprising a third oxide semiconductor between the second oxide semiconductor and the second insulator.

3. The semiconductor device according to claim 1, further comprising a third insulator over and in contact with the first conductor.

4. The semiconductor device according to claim 1, wherein the second oxide semiconductor is an oxide containing indium, an element M (M is aluminum, gallium, yttrium, or tin), and zinc.

5. A module comprising a printed board and the semiconductor device according to claim 1.

6. An electronic device comprising at least one of a speaker, an operation key, a battery and the module according to claim 5.

7. A semiconductor device comprising:
a first insulator;
a second insulator;
a first oxide semiconductor;
a second oxide semiconductor;
a first conductor; and
a second conductor,
wherein the first oxide semiconductor is over the first insulator,
wherein the second oxide semiconductor is over the first oxide semiconductor,
wherein the first conductor comprises a region in contact with a top surface of the second oxide semiconductor,
wherein the first conductor covers a side surface of the first oxide semiconductor,
wherein the second insulator is over the second oxide semiconductor,
wherein the second conductor is over the second oxide semiconductor with the second insulator therebetween,
wherein the second oxide semiconductor comprises a first layer and a second layer,
wherein the first layer comprises a region in contact with the first oxide semiconductor,
wherein the second layer is over and in contact with the first layer, and
wherein the first layer has a lower proportion of oxygen vacancies than the second layer.

8. The semiconductor device according to claim 7, further comprising a third oxide semiconductor between the second oxide semiconductor and the second insulator.

9. The semiconductor device according to claim 7, further comprising a third insulator over and in contact with the first conductor.

10. The semiconductor device according to claim 7, wherein the second oxide semiconductor is an oxide containing indium, an element M (M is aluminum, gallium, yttrium, or tin), and zinc.

11. A module comprising a printed board and the semiconductor device according to claim 7.

12. An electronic device comprising at least one of a speaker, an operation key, a battery and the module according to claim 11.

13. A semiconductor device comprising:
a first insulator;
a second insulator;
a first oxide semiconductor;
a second oxide semiconductor;
a first conductor; and
a second conductor,
wherein the first oxide semiconductor is over the first insulator,
wherein the second oxide semiconductor is over the first oxide semiconductor,
wherein the first conductor comprises a region in contact with a top surface of the second oxide semiconductor,
wherein the second insulator is over the second oxide semiconductor,
wherein the second conductor is over the second oxide semiconductor with the second insulator therebetween,
wherein the second oxide semiconductor comprises a first layer and a second layer,
wherein the first layer comprises a region in contact with the first oxide semiconductor,
wherein the second layer is over and in contact with the first layer, and
wherein the second layer has higher carrier density than the first layer.

14. The semiconductor device according to claim 13, further comprising a third oxide semiconductor between the second oxide semiconductor and the second insulator.

15. The semiconductor device according to claim 13, further comprising a third insulator over and in contact with the first conductor.

16. The semiconductor device according to claim 13, wherein the second oxide semiconductor is an oxide containing indium, an element M (M is aluminum, gallium, yttrium, or tin), and zinc.

17. A module comprising a printed board and the semiconductor device according to claim 13.

18. An electronic device comprising at least one of a speaker, an operation key, a battery and the module according to claim 17.

* * * * *